(12) United States Patent
McGraw et al.

(10) Patent No.: US 12,127,467 B2
(45) Date of Patent: *Oct. 22, 2024

(54) ORGANIC VAPOR JET MICRO-PRINT HEAD WITH MULTIPLE GAS DISTRIBUTION ORIFICE PLATES

(71) Applicant: Universal Display Corporation, Ewing, NJ (US)

(72) Inventors: Gregory McGraw, Yardley, PA (US); William E. Quinn, Whitehouse Station, NJ (US); Roman Korotkov, Cranbury, NJ (US)

(73) Assignee: Universal Display Corporation, Ewing, NJ (US)

( * ) Notice: Subject to any disclaimer, the term of this patent is extended or adjusted under 35 U.S.C. 154(b) by 513 days.

This patent is subject to a terminal disclaimer.

(21) Appl. No.: 17/370,050

(22) Filed: Jul. 8, 2021

(65) Prior Publication Data

US 2021/0343942 A1 Nov. 4, 2021

Related U.S. Application Data

(63) Continuation of application No. 16/711,476, filed on Dec. 12, 2019, now Pat. No. 11,088,325.
(Continued)

(51) Int. Cl.
*H10K 71/13* (2023.01)
*B05C 5/02* (2006.01)
(Continued)

(52) U.S. Cl.
CPC ......... *H10K 71/135* (2023.02); *B05C 5/0275* (2013.01); *B41J 2/1433* (2013.01); *H10K 71/00* (2023.02); *H10K 85/40* (2023.02)

(58) Field of Classification Search
None
See application file for complete search history.

(56) References Cited

U.S. PATENT DOCUMENTS

| 4,769,292 A | 9/1988 | Tang |
| 5,247,190 A | 9/1993 | Friend |

(Continued)

FOREIGN PATENT DOCUMENTS

| CN | 102596576 A | 7/2012 |
| CN | 104704605 A | 6/2015 |

(Continued)

OTHER PUBLICATIONS

Baldo et al. Highly efficient phosphorescent emission from organic electroluminescent devices, Nature, vol. 395, pp. 151-154, 1998.
(Continued)

*Primary Examiner* — Alejandro Valencia
(74) *Attorney, Agent, or Firm* — Butzel Long

(57) ABSTRACT

Embodiments of the disclosed subject matter provide a micronozzle array including a linear array having a plurality of depositors connected in series, where a first depositor of the plurality of depositors may border a second depositor on a least one side boundary. The micronozzle array may include plurality of orifice arrays, where a width of each orifice in the plurality of orifice arrays is 20 µm or less in a minor axis of its cross section to flow, to regulate flow through a delivery gas distribution channel. The micronozzle array may include a plurality of exhaust distribution channels, where the delivery gas distribution channel and at least one of the plurality of exhaust distribution channels have separate fluid communication with each of the plurality of depositors.

20 Claims, 29 Drawing Sheets

Related U.S. Application Data

(60) Provisional application No. 62/794,265, filed on Jan. 18, 2019.

(51) Int. Cl.
  *B41J 2/14* (2006.01)
  *H10K 71/00* (2023.01)
  *H10K 85/40* (2023.01)

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,968,146 B2 | 6/2011 | Wagner |
| 8,679,369 B2 | 3/2014 | Ohmi |
| 8,944,309 B2 | 2/2015 | Forrest |
| 11,088,325 B2 * | 8/2021 | McGraw ............. C23C 14/04 |
| 2003/0230980 A1 | 12/2003 | Forrest |
| 2004/0174116 A1 | 9/2004 | Lu |
| 2004/0216668 A1 | 11/2004 | Lindfors |
| 2009/0128787 A1 | 5/2009 | Yamamoto |
| 2013/0038649 A1 | 2/2013 | Lowrance |
| 2013/0208036 A1 | 8/2013 | Forrest |
| 2015/0033872 A1 * | 2/2015 | Fishler ............. G09B 23/30 73/861.05 |
| 2015/0376787 A1 | 12/2015 | Mcgraw |
| 2017/0217161 A1 * | 8/2017 | Wagner ............. B41J 2/04513 |
| 2017/0229663 A1 | 8/2017 | Tsai |
| 2017/0246892 A1 | 8/2017 | Lowrance |
| 2017/0294615 A1 | 10/2017 | Van Den Tillaart |
| 2018/0258521 A1 | 9/2018 | Inoue |
| 2019/0232325 A1 | 8/2019 | Mcgraw |

FOREIGN PATENT DOCUMENTS

| | | |
|---|---|---|
| CN | 105316623 A | 2/2016 |
| CN | 107073955 A | 8/2017 |
| CN | 107425141 A | 12/2017 |
| CN | 108930016 A | 12/2018 |
| ES | 2107605 T3 | 12/1997 |
| JP | 2016008355 A | 1/2016 |
| KR | 20180129690 A | 12/2018 |
| WO | 2008057394 A1 | 5/2008 |
| WO | 2010011390 A2 | 1/2010 |
| WO | 2018023046 A1 | 2/2018 |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Extended European Search Report for App. No. EP20152519.3, mailing date Jul. 23, 2020, 5 pages.

Chinese Office Action issued in App. No. CN202010053181.X, dated Mar. 2, 2022, 7 pages.

Korean Office Action (including English translation) issued in App. No. KR1020200005816, dated Feb. 18, 2024, 10 pages.

Chinese Office Action issued in App. No. CN202211267535, dated Mar. 27, 2024, 9 pages.

Japanese Office Action (including English translation) issued in App. No. JP2020001122, dated Mar. 5, 2024, 5 pages.

* cited by examiner

1109

1110

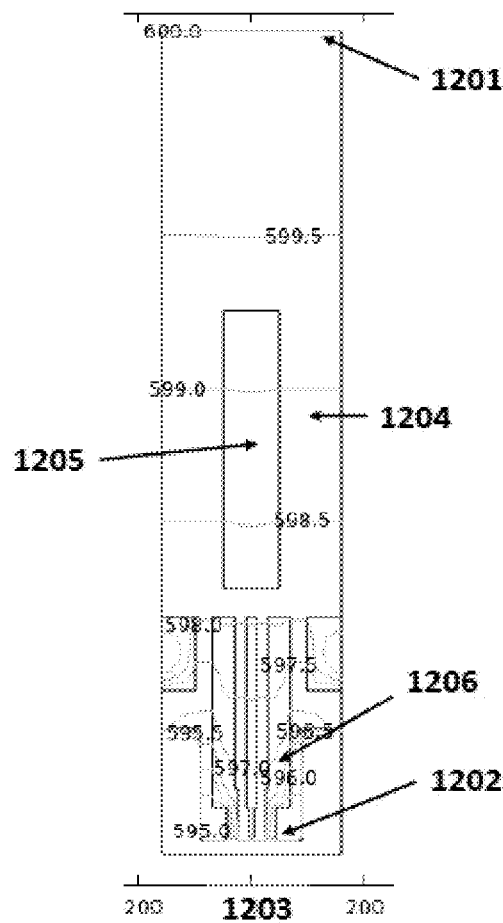 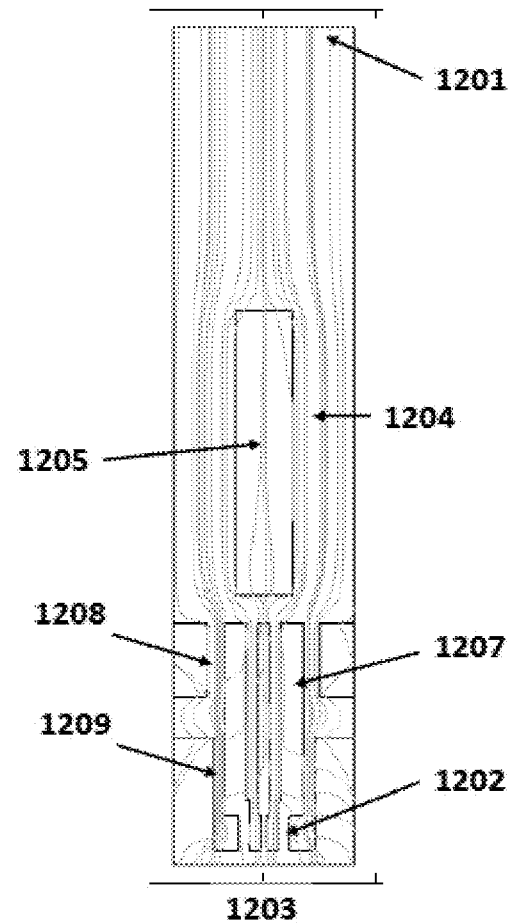
Figure 12a                    Figure 12b

ORGANIC VAPOR JET MICRO-PRINT HEAD WITH MULTIPLE GAS DISTRIBUTION ORIFICE PLATES

CROSS-REFERENCE TO RELATED APPLICATIONS

This application is a continuation of U.S. patent application Ser. No. 16/711,476, filed, Dec. 12, 2019, which claims priority to U.S. patent application Ser. No. 62/794,265, filed Jan. 18, 2019, the entire contents of which are incorporated herein by reference.

FIELD

The present invention relates to a micronozzle array for organic vapor jet printing (OVJP). In particular, depositors are placed in fluid communication with two or more gas distribution channels within the micronozzle array die through two or more orifice plates.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to an embodiment, a device having a micronozzle array including a linear array with a plurality of depositors connected in series may be provided, where a first depositor of the plurality of depositors may border a second depositor on a least one side boundary. The micronozzle array may include plurality of orifice arrays, where a width of each orifice in the plurality of orifice arrays is 20 μm or less in a minor axis of its cross section to flow, to regulate flow through a delivery gas distribution channel. The micronozzle array may include a plurality of exhaust distribution channels, where the delivery gas distribution channel and at least one of the plurality of exhaust distribution channels have separate fluid communication with each of the plurality of depositors.

A first orifice array of the plurality of orifice arrays may be disposed in a first direction to regulate the delivery gas distribution channel. A second orifice array of the plurality of orifice arrays may be disposed in a second direction to regulate at least one of the plurality of exhaust distribution channels.

The linear array of depositors may include a planar surface including one or more delivery apertures that are in fluid communication with the delivery gas distribution channel are disposed between a plurality of exhaust apertures that are in fluid communication with at least one of the plurality of exhaust distribution channels via an exhaust channel. A spacer may separate each of the one or more delivery apertures from at least one of the plurality of exhaust apertures. The one or more delivery apertures may be divided into a plurality of sections. At least one of the delivery apertures and the exhaust apertures is rectangular. The at least one of the delivery apertures and the exhaust apertures may be arranged with a long axis parallel to a direction of printing. A delivery channel for the at least one of the delivery apertures may be connected to the delivery gas distribution channel through a delivery orifice. The exhaust apertures that are coupled to the exhaust channels may disposed collinearly with the delivery channel. The exhaust channels may connect to at least one of the plurality of exhaust distribution channels through an orifice array that has a greater flow restriction than the exhaust apertures.

The device may include a plurality of ranks of the linear array of depositors, where a first edge or a second edge of each depositor may be defined by a first edge or a second edge of the micronozzle array.

The linear array having the plurality of depositors may include confinement gas distribution trenches disposed between at least the first depositor and the second depositor. The linear array having the plurality of depositors may include a plurality of delivery apertures, which are fed from the delivery gas distribution channel. A length in a print direction of each aperture of the depositors in the array may be 50 μm to 5 mm. Each depositor of the linear array having the plurality of depositors may be separated from one exhaust by a first spacer on one side, and a second spacer on another side, wherein the first spacer is narrower than the second spacer.

The micronozzle array may be disposed on one face of a die that is affixed to a carrier plate on an opposite face of the die. The carrier plate may have ports for delivery gas from the delivery gas distribution channel and exhaust gas from at least one of the plurality of exhaust gas distribution channels that connect to respective vias on the die. The carrier plate may be sealed to a manifold by using gaskets. The carrier plate may be bolted to a manifold.

Each depositor may be formed on a boss, and a recessed region may be disposed between bosses. A height of the boss from the recessed region may be 0-200 μm. The plurality of depositors of the linear array may be staggered.

One of the plurality of orifice arrays may be a delivery gas orifice array which forms a floor of the delivery gas distribution channel. The plurality of exhaust distribution channels may be disposed perpendicular to the delivery gas distribution channel. The exhaust distribution channel may be fluidly coupled to at least one exhaust via located on a corresponding at least one side of the first depositor of the linear array having the plurality of depositors. At least one of the plurality of exhaust distribution channels may be shared by adjacent depositors of the linear array within a rank. One of the plurality of orifice arrays may be an exhaust gas orifice array that is disposed between an exhaust channel of the first depositor and at least one of the plurality of exhaust distribution channels, which provides a conductance path across a sidewall separating the at least one exhaust distribution channel from an exhaust channel of the first depositor.

The micronozzle array may include a first layer, having a first surface and second surface, adjacent to a carrier plate. The micronozzle array may include a second layer, having a first surface and a second surface, adjacent to a substrate. A device layer may be disposed between the first layer and the second layer that includes a pattern of holes, where the first layer and the second layer are patterned with holes and trenches on their first and second surfaces, respectively. A thickness of the first layer and the second layer may be greater than the device layer. At least one of the first layer and the second layer may have a thickness that is greater than 300 μm, and the device layer may have a thickness that is less than or equal to 100 μm.

The micronozzle array may include a plurality of double side polished (DSP) wafers and a silicon-on-insulator wafer. A handle layer of the silicon-on-insulator wafer has a thickness of 300-600 μm and a device layer of a silicon-on-insulator wafer has a thickness of 10-50 μm.

One of the plurality of orifice arrays may be a delivery channel orifice array that includes apertures that are coupled to the delivery gas distribution channel via a delivery channel. The apertures may be clustered in groups of three, with a constant length of 10 μm along a channel axis. The apertures may be wider with increasing distance from a delivery via, where the apertures may increase in width from 110 to 184 μm.

The delivery gas distribution channel may include a plurality of channels that are in separate fluid communication with each of the plurality of depositors. The plurality of depositors may form features on a surface with a fill factor of 5% to 75%. The device may an unbroken heat conduction path of solid material disposed parallel to a normal vector to a face of the device.

BRIEF DESCRIPTION OF THE DRAWINGS

FIG. 12a shows a contour plot of the temperature distribution through a section of the die according to an embodiment of the disclosed subject matter.

FIG. 12b shows lines of heat flux through a section of the die according to an embodiment of the disclosed subject matter.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
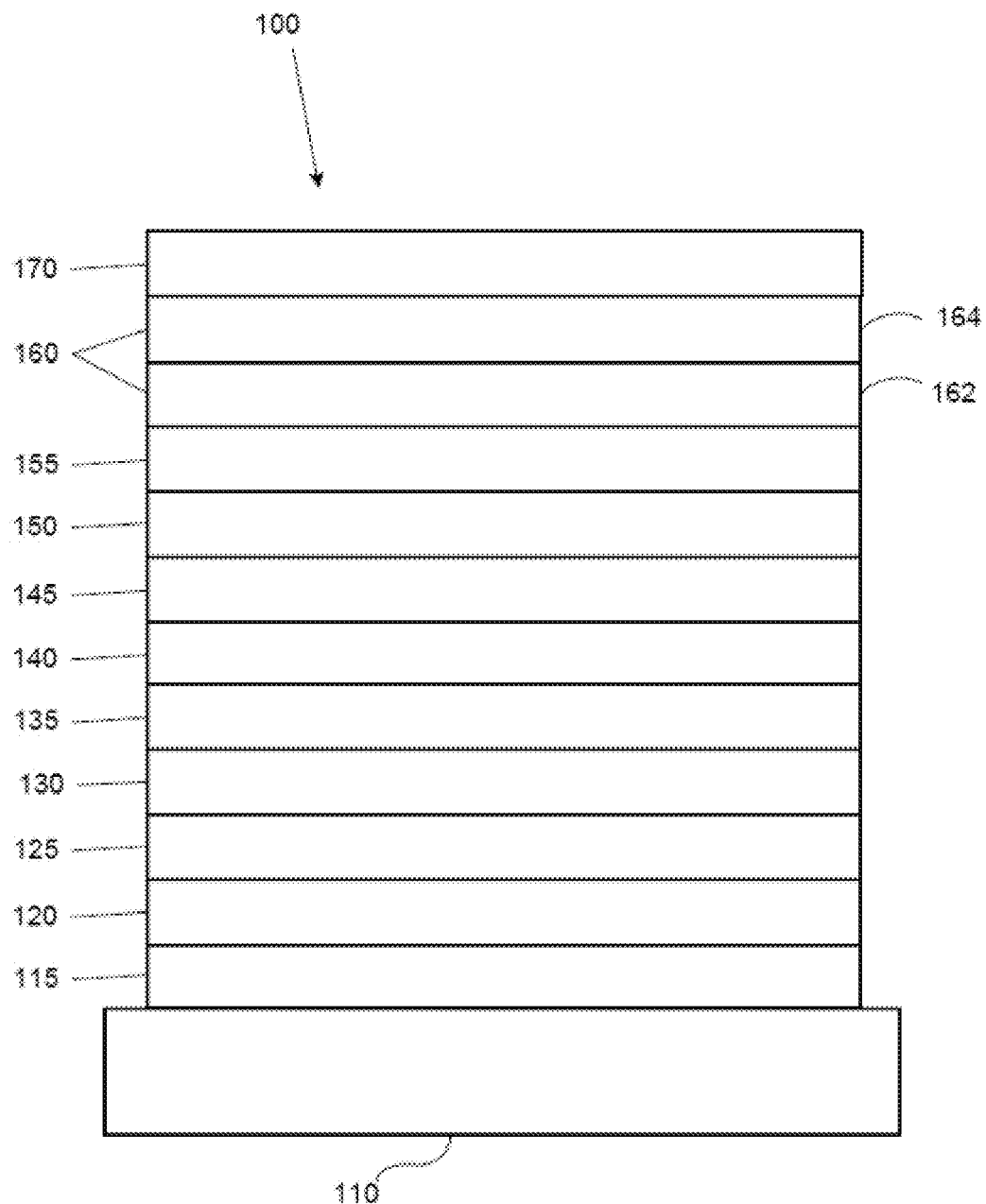
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 50, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
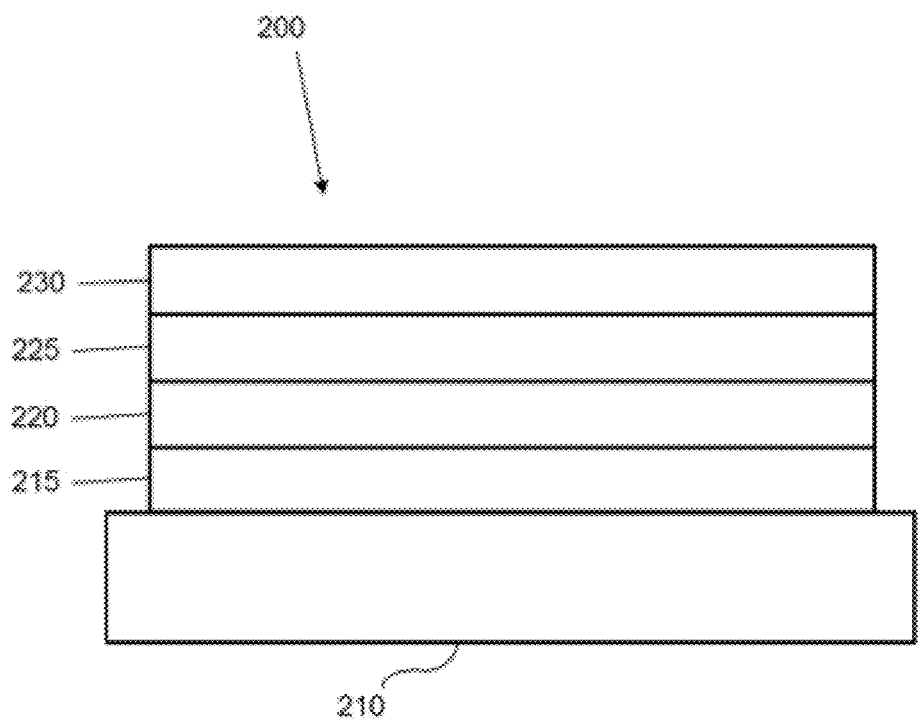
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In some embodiments disclosed herein, emissive layers or materials, such as emissive layer 135 and emissive layer 220 shown in FIGS. 1-2, respectively, may include quantum dots. An "emissive layer" or "emissive material" as disclosed herein may include an organic emissive material and/or an emissive material that contains quantum dots or equivalent structures, unless indicated to the contrary explicitly or by context according to the understanding of one of skill in the art. Such an emissive layer may include only a quantum dot material which converts light emitted by a separate emissive material or other emitter, or it may also include the separate emissive material or other emitter, or it may emit light itself directly from the application of an electric current. Similarly, a color altering layer, color filter, upconversion, or downconversion layer or structure may include a material containing quantum dots, though such layer may not be considered an "emissive layer" as disclosed herein. In general, an "emissive layer" or material is one that emits an initial light, which may be altered by another layer such as a color filter or other color altering layer that does not itself emit an initial light within the device, but may re-emit altered light of a different spectra content based upon initial light emitted by the emissive layer.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18° C. to 30° C., and more preferably at room temperature (20-25° C.), but could be used outside this temperature range, for example, from −40° C. to 80° C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used may be a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein.

Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

Figure 3:
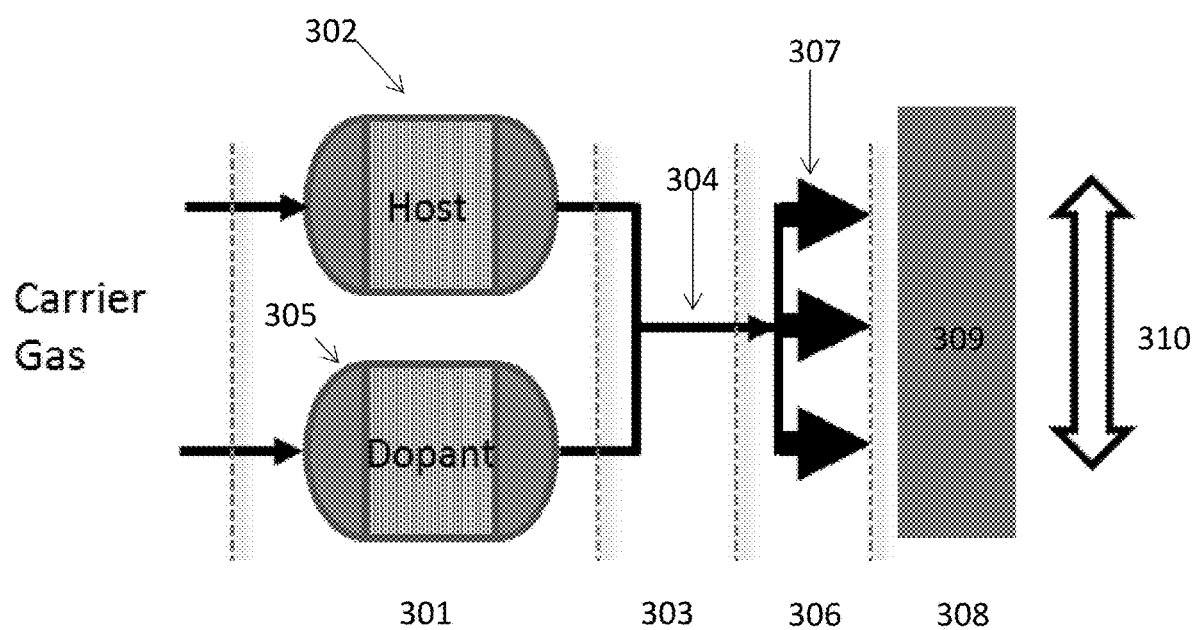
FIG. 3 shows a simplified process flow diagram of the OVJP (organic vapor jet printing) process according to an embodiment of the disclosed subject matter.

Organic Vapor Jet Printing (OVJP) is a solvent-less organic thin film deposition technology that may be used to print OLED displays. OVJP may utilize a carrier gas to transport organic material from a heated source container to a print nozzle assembly which is in close proximity to a substrate. As illustrated in FIG. 3, the OVJP process may be divided into four basic operations: entrainment, mixing, jetting, and condensation. At operation 301, organic vapor generated in a source such as a sublimation oven 302 may be entrained in a stream of inert gas. At operation 303, vapors and gas streams may be mixed in a heated plenum 304 and may be optionally mixed with streams from other vapor sources 305 to make a film of the desired composition. At operation 306, a flow of mixed vapor is collimated into jets by an array of heated nozzles 307. At operation 308, organic vapor may condense on a substrate 309 where the jet impinges. The substrate may be cooler than the sublimation temperature of the organic vapor and may be actively cooled. A patterned thin film may be generated by moving 310 the substrate relative to the nozzle. In some embodiments, films may be printed as continuous lines rather than discrete pixels so that the OVJP system may operate in steady state.

The design of the print nozzle assembly and the deposition conditions may determine characteristics of the printed line. Some print heads are capable of producing printed lines with the line width (on the order of 50 µm) to deposit the emissive layers of individual subpixels in a multicolor OLED display, but the lines had overspray and printing could not be started and stopped rapidly. In embodiments of the disclosed subject matter, a micronozzle array that utilizes a combination of deposition apertures surrounded by exhaust apertures and a gas confinement flow may be used to confine the line width and overspray. This arrangement may be referred to as DEC (Deposition Exhaust Confinement).

Figure 4A:
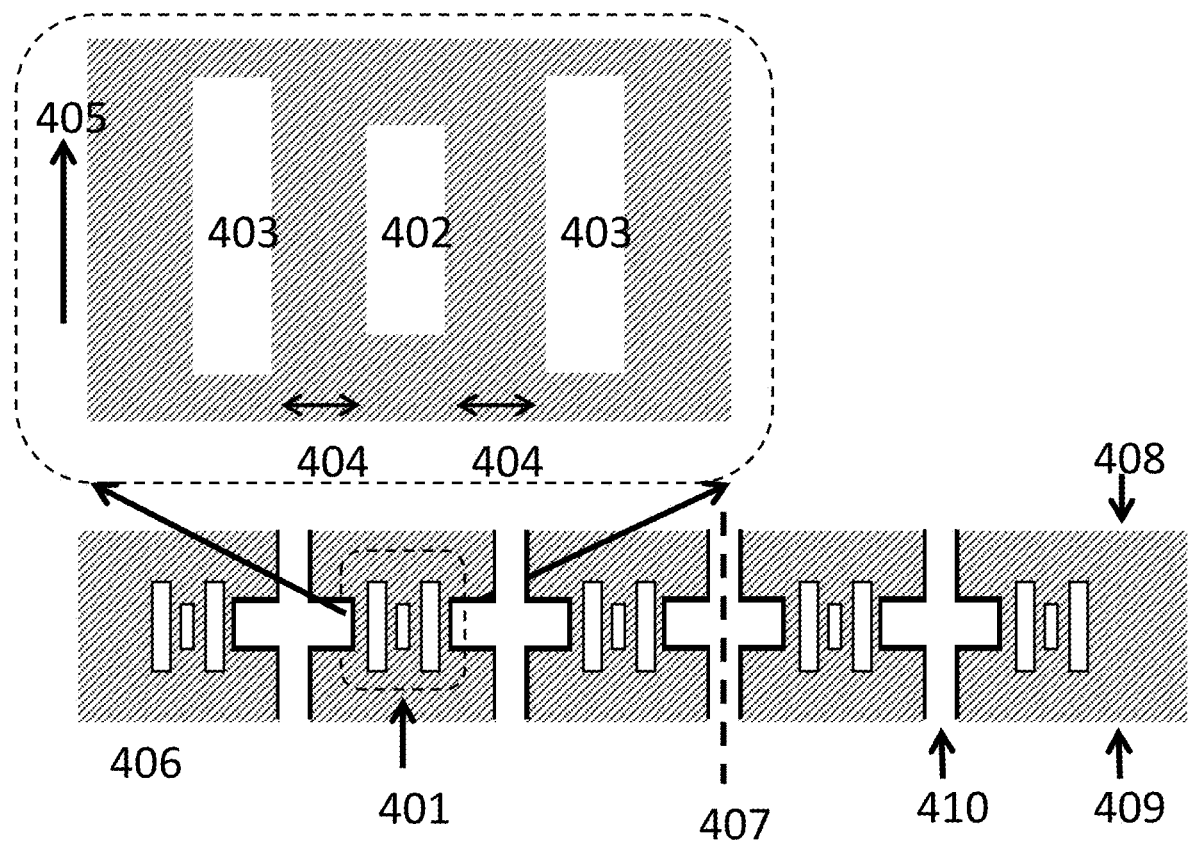
FIG. 4a shows a facial view of a DEC (Deposition Exhaust Confinement) OVJP depositor and a micronozzle array including a linear array of multiple depositors according to an embodiment of the disclosed subject matter.

Gas confinement with the DEC may differ from previous OVJP arrangements, as a chamber pressure of 50 to 300 Torr is used, rather than high vacuum. Overspray may be eliminated by using a flow of confinement gas to prevent the diffusion and transport of organic material away from the desired deposition region. The DEC depositor design, shown from the perspective of the substrate in FIG. 4a, may include a planar surface 401 ported with one or more delivery apertures 402 disposed between a pair of exhaust apertures 403. The flow through the delivery apertures may include organic vapor entrained in an inert delivery gas. Exhaust apertures may withdraw gas from the region under the depositor at a mass flow rate exceeding the delivery flow. The exhausts may remove the delivery flow and any surplus organic vapor entrained within it, as well as a balance of confinement gas drawn from the ambient surrounding the depositor. Delivery and exhaust apertures may be separated by a DE spacer 404 (i.e., a depositor exhaust spacer). The apertures may be rectangular and may be arranged with the long axes of the aperture parallel to the direction of printing 405.

In some embodiments, depositors may arranged linearly on a micronozzle array 406, so that each depositor borders another on at least one side boundary 407. The top 408 and bottom 409 edges of the depositor may be defined by the edges of the micronozzle array. Confinement gas distribution trenches 410 etched into the lower face of the depositor provide a low impedance path for confinement gas so that its flow is evenly distributed across the side boundaries of each depositor. Alternately, confinement gas may flow in from the edges of the depositor, particularly if these channels are omitted. Arrays may minimize crosstalk between depositors so that multiple printed features are as close to identical as possible across the width of the depositor array. Additional exhaust apertures may be placed at the ends of the array, for example, to minimize edge effects. In some embodiments, the flow field under a micronozzle array may have periodic symmetry. Depositors may have apertures with different shapes, where the shape may produce features of specific sizes and feature profiles. If a depositor contains multiple delivery apertures, the apertures may be fed from a common delivery channel.

The average thickness t of a printed film may be given by $t=\eta_c j_v \tau/\rho$, where $j_v$ may be the mass flux of organic vapor onto the substrate, $\tau$ may be the period a given point on the substrate is under the aperture, and $\rho$ may be the density of the condensed organic material. The utilization efficiency, $\eta$, may be the fraction of organic vapor issuing from the depositor that condenses on the substrate. Because $\tau=l/v$, where l may be the length of the aperture and v may be the relative velocity between the print head and the substrate, a longer delivery aperture permits a given point on the substrate surface to remain under the aperture for a longer time at a given print speed. This arrangement may provide faster printing. The apertures of a DEC depositor may be generally made as long as possible.

Figure 4B:
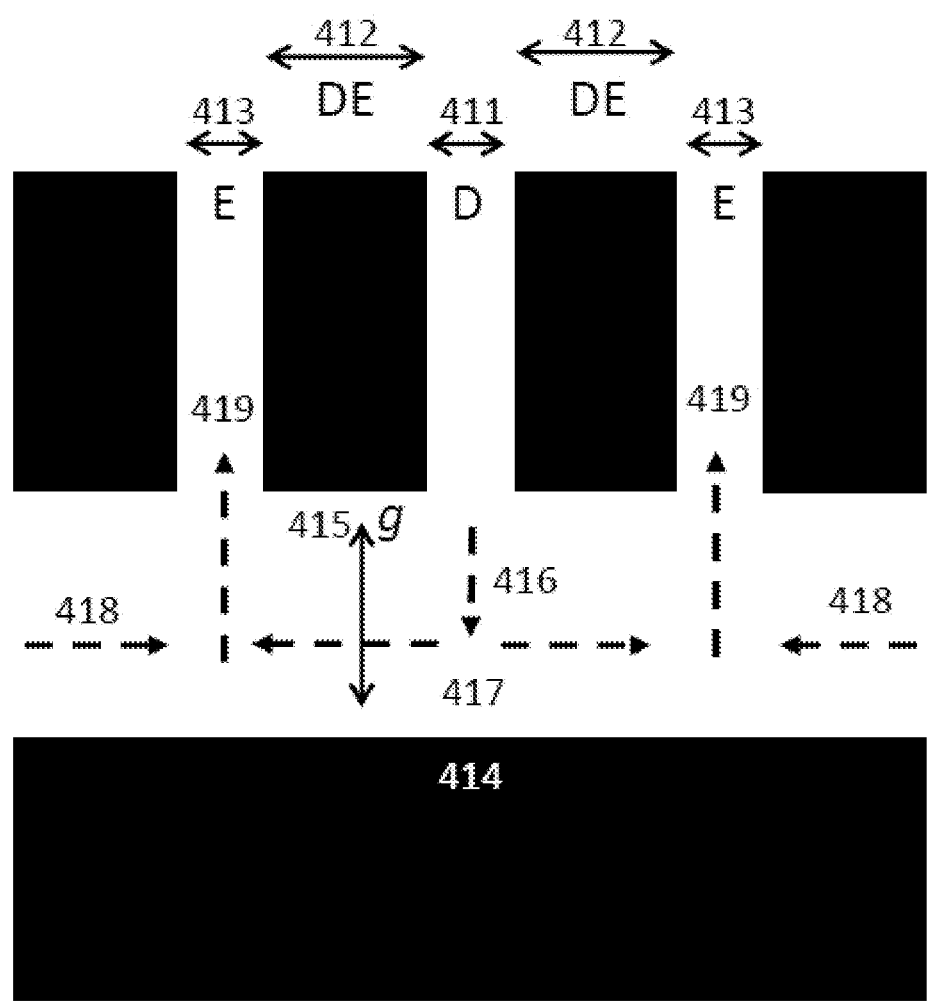
FIG. 4b shows a cross section of a DEC OVJP depositor according to an embodiment of the disclosed subject matter.

A DEC depositor is shown in cross-section normal to the direction of printing in FIG. 4b. The dimensions defining the geometry of the DEC depositor are also shown in FIG. 4b. The width of the delivery aperture 411 is D. The mass flow rate of delivery gas through the delivery aperture is given by QD. The DE spacers between the delivery and exhaust have width DE 412 and the exhausts have width E 413. The mass flow rate of gas through the exhaust apertures of a depositor is QE. The depositor and substrate 414 may be separated by a fly height gap g 415. The flow patterns of process gas may be indicated by dashed arrows. A flow of delivery gas 416 laden with the organic vapor may enter through the delivery aperture at a mass flow rate of QD. This flow may deposit a thin film of organic material where it impinges on the substrate 417. The spread of undeposited organic vapor in the plane of the substrate may be resisted by a flow of confinement gas 418 that enters through the sides of the depositor at a rate of QC. Delivery and confinement flows may meet under each exhaust aperture, and may be withdrawn from the deposition zone in an exhaust flow 419 with mass flow rate QE.

Figure 5A:
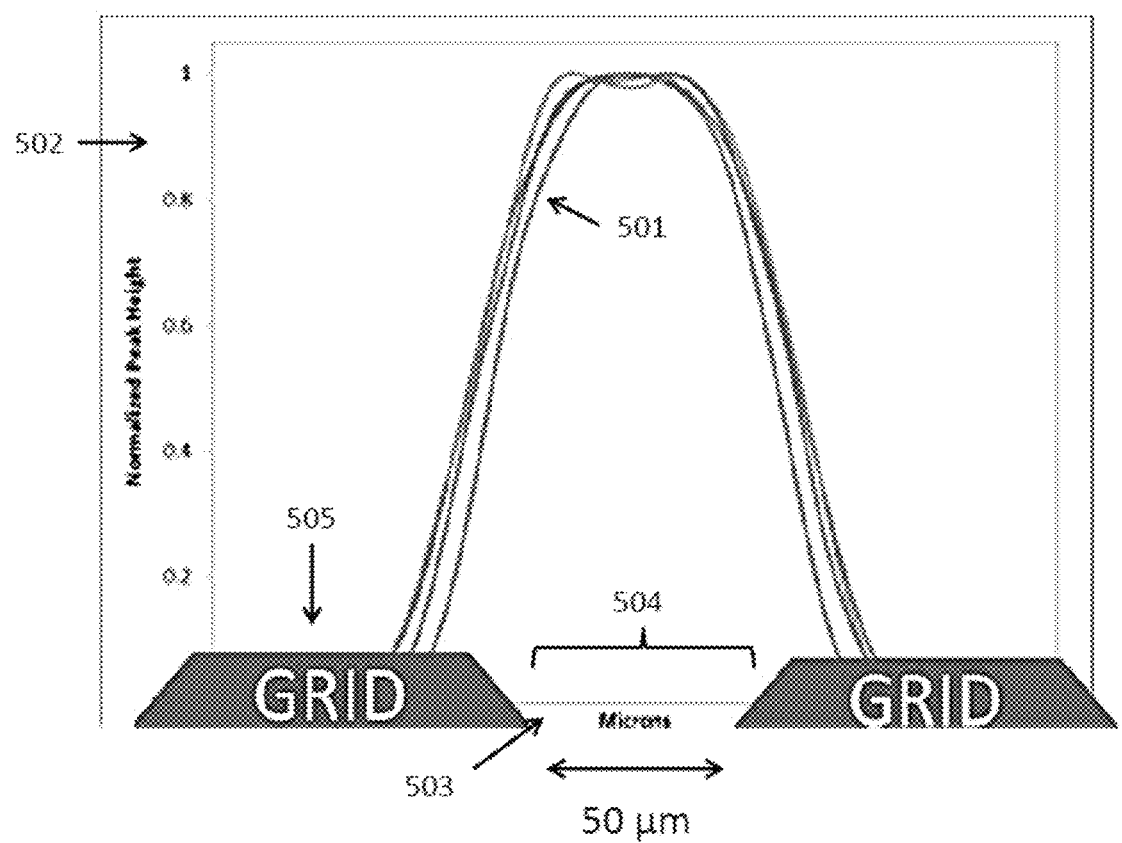
FIG. 5a shows examples of thickness profiles of lines printed by OVJP according to embodiments of the disclosed subject matter.

Embodiments of the disclosed subject matter provide uniform film thickness within the active area of a device, and printed features may have a mesa-like thickness profile. FIG. 5a shows mesa-like deposition profiles possible with DEC OVJP depositors and shows profilometry traces 501 for several lines printed under different process conditions. The vertical axis 502 shows normalized feature thickness, and the horizontal axis 503 indicates offset from the center of the line. The targeted printing zone may be an active area 504 between two regions of dielectric grid 505 that define the boundaries between subpixels in an OLED display. In some embodiments, the target zone may be 50 µm wide. Line profiles may range from near-Gaussian to approximately mesa-shaped, depending on process conditions. In some embodiments, the flat top of the mesa may be as wide as the active area, and the tails of the printed profile may not extend beyond the grid into the active area of a neighboring device.

Figure 5B:
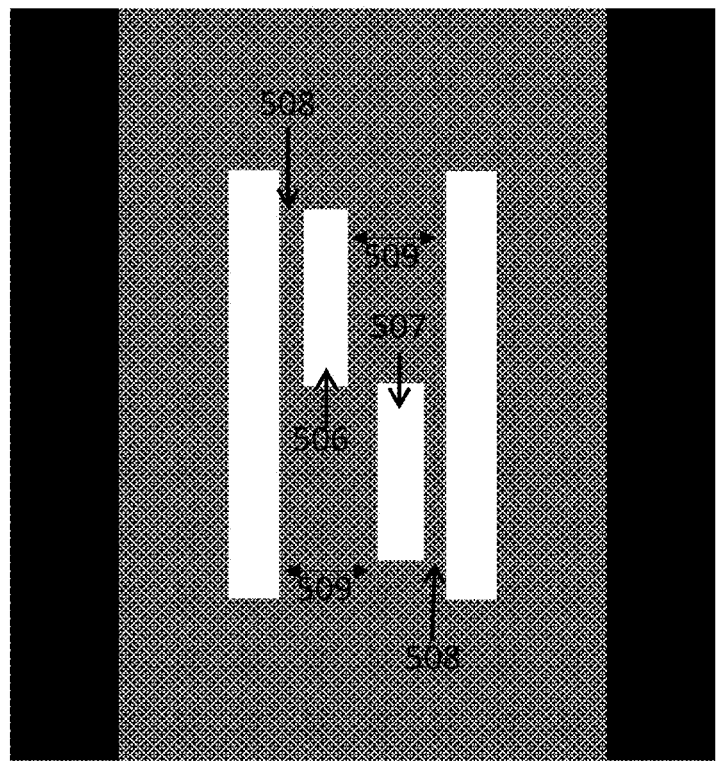
FIG. 5b shows a depositor to print subpixel sized regions of constant thickness according to an embodiment of the disclosed subject matter.

A depositor, such as the one shown in FIG. 5b, may be used to print mesa-like thin film features. The delivery aperture may be split into sections 506 and 507, where the thickest portion of the of the deposition profile generated by each section may be offset from the other, and the combined printed feature created by a depositor moving with respect to a substrate may have a widened, mesa-like top. Complete features can be printed in a single pass, while depositors that produce features with a more Gaussian thickness distribution may require multiple passes. The depositor may be rotation symmetric, with each depositor being separated from one exhaust by a narrow spacer 508 on one side, and a wide spacer 509 on the other side. This structure is disclosed in U.S. patent application Ser. No. 15/475,408 filed Mar. 31, 2017 (now U.S. Patent Publn. No. 2017/0294615) and can be readily fabricated using techniques disclosed in U.S. Patent Publn. No. 2015/0376787, both of which are incorporated by reference in their entirety.

Figure 5C:
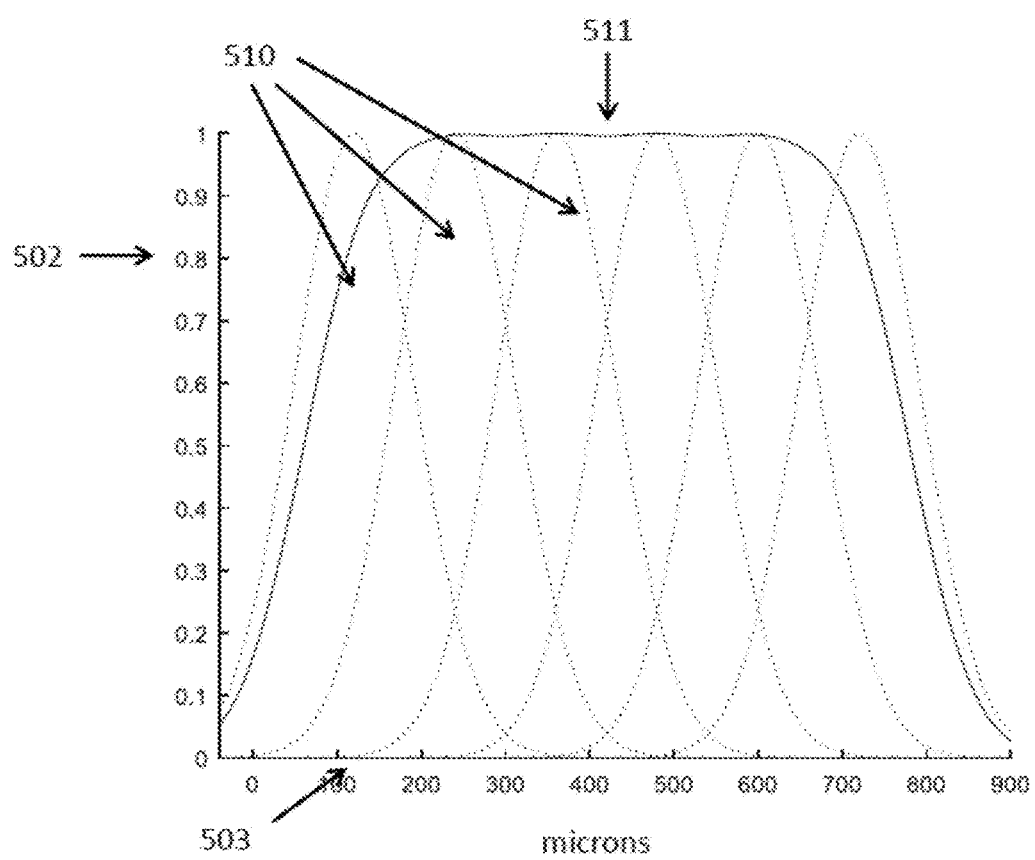
FIG. 5c shows how lines printed by OVJP may be superimposed to print films of constant thickness according to an embodiment of the disclosed subject matter.

Blanket films of uniform thickness may be approximated by rastering the nozzles to generating overlapping lines as illustrated in FIG. 5c. Individual Gaussian deposition profiles 510 (shown as dashed lines) may be summed to form a film 511 (shown as a solid line) with a thickness variation of no more than ±0.5%. In this embodiment, individual profiles may have a standard deviation of 7.7 µm, and may be spaced 120 µm center-to-center. Areas of arbitrary shape may be filled in this fashion.

Figure 6A:
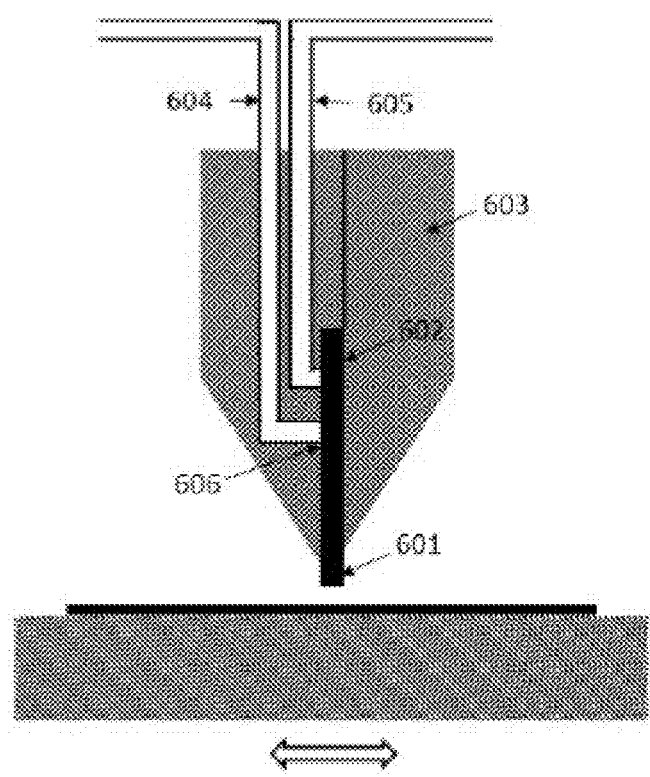
FIG. 6a shows an installation of a die with an edge-on micronozzle array in an OVJP tool according to an embodiment of the disclosed subject matter.

The apertures of an OVJP micronozzle array may be located on the edge of a silicon (Si) die, as shown in FIG. 6a. The apertures may be formed when channels within the die are bisected during singulation at the lower surface 601 of the die 602. The die 602 may be held by a heated clamp 603 that is ported with a flow path for delivery gas 604 and a flow path for exhaust gas 605. The flow path for delivery gas 604 may have a 90° turn 606 upon entering the die 602. The deliver gas 604 may flow along the plane of the die 602 to the edge. Exhaust gasses follow a reverse path.

The edge-on arrangement may have a predetermined range of feature size and geometrical complexity of the depositor. Apertures may be rectangular, and they may intersect a bond line. The depositor design may be changed to use more generalized geometries. Trenches within the die may be formed by a deep reactive ion etch (DRIE) for the straightest possible sidewalls, where there may be a variation in the slope of the sidewalls. Sidewall slope variation depends on the position of a feature on the wafer, among other factors. This limits the scalability of an in-plane design since the aperture width and therefore conductance may vary significantly across a wide micronozzle array.

In some embodiments, an in-plane micronozzle array in which apertures are co-planar with the polished die face may provide advantages over an edge-on array. The shape of each aperture may be defined with sub-micron tolerances by photolithography. This may provide greater control over the conductivity of each aperture. While an in-plane design may use deep etches, such etches may be ordered so that features are relatively shallow and unaffected by sidewall slope. In-plane apertures of arbitrary shape may be defined with photolithography. The edge-on arrangement was initially preferred over an in-plane arrangement in which depositors and vias are located on opposite sides of the die to facilitate sealing. Sealing techniques developed for in-plane micronozzle arrays are described in U.S. Pat. No. 8,944,309 and U.S. Patent Publn. No. 2019/0232325, which are incorporated by reference in their entirety.

Figure 6B:
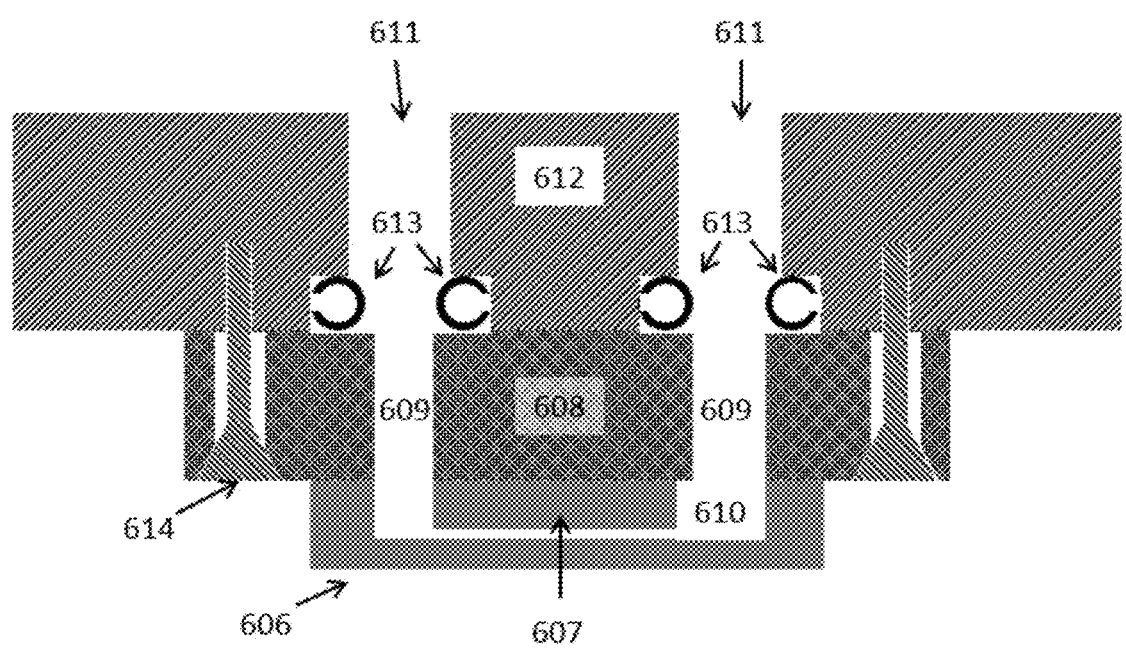
FIG. 6b shows an installation of a die with an in-plane micronozzle array in an OVJP tool according to an embodiment of the disclosed subject matter.

The layout of an in-plane print head is shown in FIG. 6b. The micronozzle array may be disposed on the lower face 606 of a die 607 that is bonded by its top face to a metal carrier plate 608. A gas tight bond may be accomplished by soldering the die to the wafer using a high melting point solder such as AuGe eutectic and appropriate die bonding techniques. The metal carrier plate 608 may have ports 609 for delivery and exhaust gasses that connect to vias 610 on the die 607 through the solder seal. The ports 609 on the carrier plate 608 may connect to ports 611 on a heated manifold 612 that handles delivery and exhaust gas flow to and from the print head. The carrier plate 608 may be sealed to the manifold 612 by compression using high temperature gaskets 613, such as c-rings. The carrier plate 608 may be bolted 614 to the manifold 612. The carrier plate 608 may act as an adaptor, bridging the components of the die 607 to the larger components for high purity vapor phase printing.

Embodiments of the disclosed subject matter may improve upon in-plane print head designs. First, the embodiments reduce the perimeter of delivery gas conduit under positive pressure with that must be sealed. Second, the embodiments reduce the length of substrate placed under thermal load by the print head relative to the length of the delivery apertures. This reduces the amount of heat transferred to the substrate at a given printing rate. Embodiments of the disclosed subject matter provide a micronozzle array for organic vapor jet printing that includes at least at least two orifice arrays that regulate flow through at least two separate process gas distribution channels servicing depositors in the micronozzle array.

As discussed below in connection with FIGS. 7a-12b, embodiments of the disclosed subject matter provide a device having a micronozzle array including a linear array with a plurality of depositors connected in series, where a first depositor of the plurality of depositors may border a second depositor on a least one side boundary. The micronozzle array may include plurality of orifice arrays, where the width of each orifice in the plurality of orifice arrays is 20 µm or less in a minor axis of its cross section to flow, to regulate flow through a delivery gas distribution channel. The micronozzle array may include a plurality of exhaust distribution channels, where the delivery gas distribution channel and at least one of the plurality of exhaust distribution channels have separate fluid communication with each of the plurality of depositors.

A first orifice array of the plurality of orifice arrays may be disposed in a first direction to regulate the delivery gas distribution channel. A second orifice array of the plurality of orifice arrays may be disposed in a second direction to regulate at least one of the plurality of exhaust distribution channels.

The linear array of depositors may include a planar surface including one or more delivery apertures that are in fluid communication with the delivery gas distribution channel are disposed between a plurality of exhaust apertures that are in fluid communication with at least one of the plurality of exhaust distribution channels via an exhaust channel. A spacer may separate each of the one or more delivery apertures from at least one of the plurality of exhaust apertures. The one or more delivery apertures may be divided into a plurality of sections. In some embodiments, at least one of the delivery apertures and the exhaust apertures may be rectangular. The at least one of the delivery apertures and the exhaust apertures may be arranged with a long axis parallel to a direction of printing. A delivery channel for the at least one of the delivery apertures may be connected to the delivery gas distribution channel through a delivery orifice. The exhaust apertures that are coupled to the exhaust channels may disposed collinearly with the delivery channel. The exhaust channels may connect to at least one of the plurality of exhaust distribution channels through an orifice array that has a greater flow restriction than the exhaust apertures.

The device may include a plurality of ranks of the linear array of depositors, where a first edge or a second edge of each depositor may be defined by a first edge or a second edge of the micronozzle array.

The linear array having the plurality of depositors may include confinement gas distribution trenches disposed between at least the first depositor and the second depositor. The linear array having the plurality of depositors may include a plurality of delivery apertures, which are fed from the delivery gas distribution channel. A length in a print direction of each aperture of the depositors in the array may be 50 µm to 5 mm. Each depositor of the linear array having the plurality of delivery apertures may be separated from one exhaust by a first spacer on one side, and a second spacer on another side, wherein the first spacer is narrower than the second spacer.

In some embodiments, the micronozzle array may be disposed on one face of a die that is affixed to a carrier plate on an opposite face of the die. The carrier plate may have ports for delivery gas from the delivery gas distribution channel and exhaust gas from at least one of the plurality of exhaust gas distribution channels that connect to respective vias on the die. The carrier plate may be sealed to a manifold by using gaskets. The carrier plate may be bolted to a manifold.

In some embodiments, each depositor may be formed on a boss, and a recessed region may be disposed between bosses. A height of the boss from the recessed region may be 0-200 µm. The plurality of depositors of the linear array may be staggered.

In some embodiments, one of the plurality of orifice arrays may be a delivery gas orifice array which forms a floor of the delivery gas distribution channel. The plurality of exhaust distribution channels are disposed perpendicular to the delivery gas distribution channel. The exhaust distribution channel is fluidly coupled to at least one exhaust via located on a corresponding at least one side of the first depositor of the linear array having the plurality of depositors. At least one of the plurality of exhaust distribution channels may be shared by adjacent depositors of the linear array within a rank. One of the plurality of orifice arrays may be an exhaust gas orifice array that is disposed between an exhaust channel of the first depositor and at least one of the plurality of exhaust distribution channels, which provides a conductance path across a sidewall separating the at least one exhaust distribution channel from an exhaust channel of the first depositor.

In some embodiments, the micronozzle array may include a first layer, having a first surface and second surface, adjacent to a carrier plate. The micronozzle array may include a second layer, having a first surface and a second surface, adjacent to a substrate. A device layer may be disposed between the first layer and the second layer that includes a pattern of holes, where the first layer and the second layer may be patterned with holes and trenches on their first and second surfaces, respectively. A thickness of the first layer and the second layer may be greater than the device layer. At least one of the first layer and the second layer may have a thickness that is greater than 300 µm, and the device layer may have a thickness that is less than or equal to 100 µm.

The micronozzle array may include a plurality of double side polished (DSP) wafers and a silicon-on-insulator wafer. A handle layer of the silicon-on-insulator wafer has a thickness of 300-600 µm and a device layer of a silicon-on-insulator wafer has a thickness of 10-50 µm.

In some embodiments, one of the plurality of orifice arrays may be a delivery channel orifice array that includes apertures that are coupled to the delivery gas distribution channel via a delivery channel. The apertures may be clustered in groups of three, with a constant length of 10 µm along a channel axis. The apertures may be wider with increasing distance from a delivery via, where the apertures may increase in width from 110 to 184 µm.

In some embodiments, the delivery gas distribution channel may include a plurality of channels that are in separate fluid communication with each of the plurality of depositors. The plurality of depositors may form features on a surface with a fill factor of 5% to 75%. The device may an unbroken heat conduction path of solid material disposed parallel to a normal vector to a face of the device.

Figure 7A:
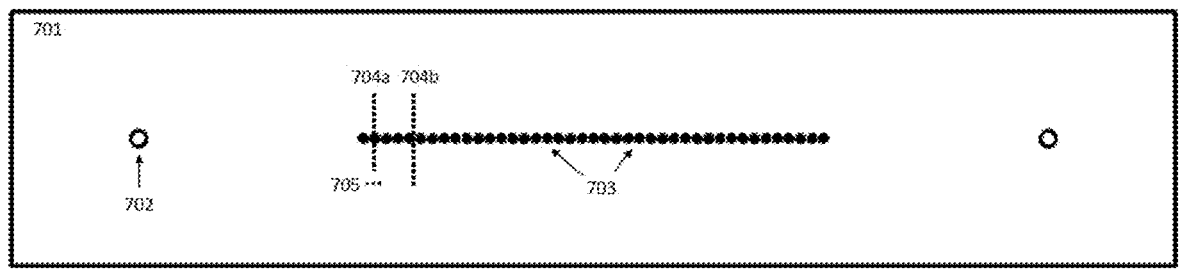
FIG. 7a shows a top (carrier plate adjacent) face of a die including an in-plane micronozzle array design according to an embodiment of the disclosed subject matter.

FIG. 7a shows the micronozzle array of an embodiment of the disclosed subject matter from its top surface 701. The top surface 701 may be sealed to the carrier plate in fluid communication with organic vapor sources and an exhaust reservoir through a heated manifold. The top surface 701 may include two delivery vias 702, one on each end of the micronozzle array, that accept delivery gas laden with organic vapor. The top surface 701 may include a plurality of exhaust apertures 703 that may withdraw process gas and surplus organic vapor captured by the micronozzle array. The delivery vias 702 may be positioned on the ends of the micronozzle array to minimize the perimeter of fluid interface under positive pressure that may be sealed. The exhaust apertures 703 may be distributed across the array to minimize flow impedance. The orientation of three cross sections used in subsequent figures (e.g., FIGS. 7b, 7c, and 7d) may be shown in the FIG. 7a as well. The first cross section may run along the length of the depositor and may bisect an exhaust via 704a, the second cross section may run parallel to the first cross section and may bisect a plane between exhaust vias 704b, and the third cross section may run along the width of a depositor 705.

Figure 7B:
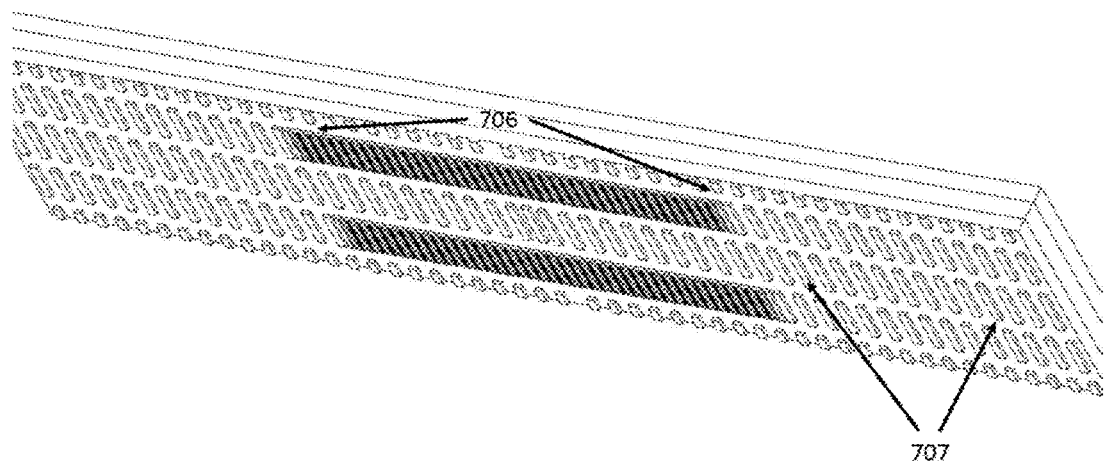
FIG. 7b shows a bottom (substrate adjacent) face of a die including an in-plane micronozzle array design according to an embodiment of the disclosed subject matter.

FIG. 7b shows the substrate-facing side of the micronozzle array according to an embodiment of the disclosed subject matter. The substrate-facing side may include an array of depositors 706 arranged side-by-side in two linear ranks. Each depositor may be mounted on a boss with recessed regions between bosses to promote uniform confinement gas flow between depositors and reduce heat transfer between the micronozzle array and substrate. The ranks may be staggered by a fraction of a subpixel period to create a mesa-like deposition profile from a superposition of near-overlapping lines like the split depositor shown in FIG. 5b. The depositor bosses may be surrounded by an array of bumper bosses 707 that lack apertures.

Figure 7C:
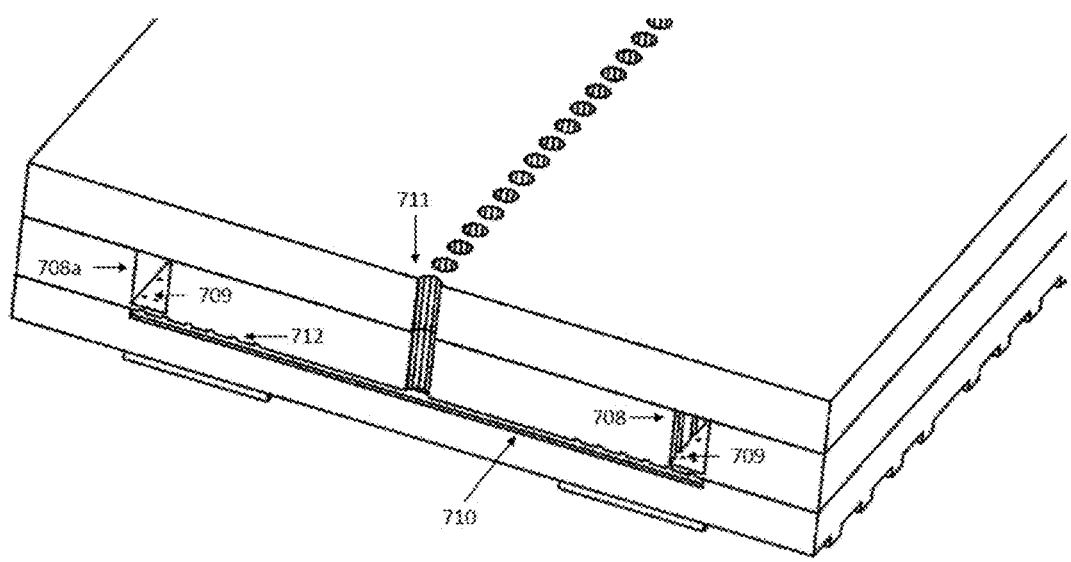
FIG. 7c shows the internal structure of the in-plane micronozzle array in a sectioned view according to an embodiment of the disclosed subject matter.
Figure 7D:
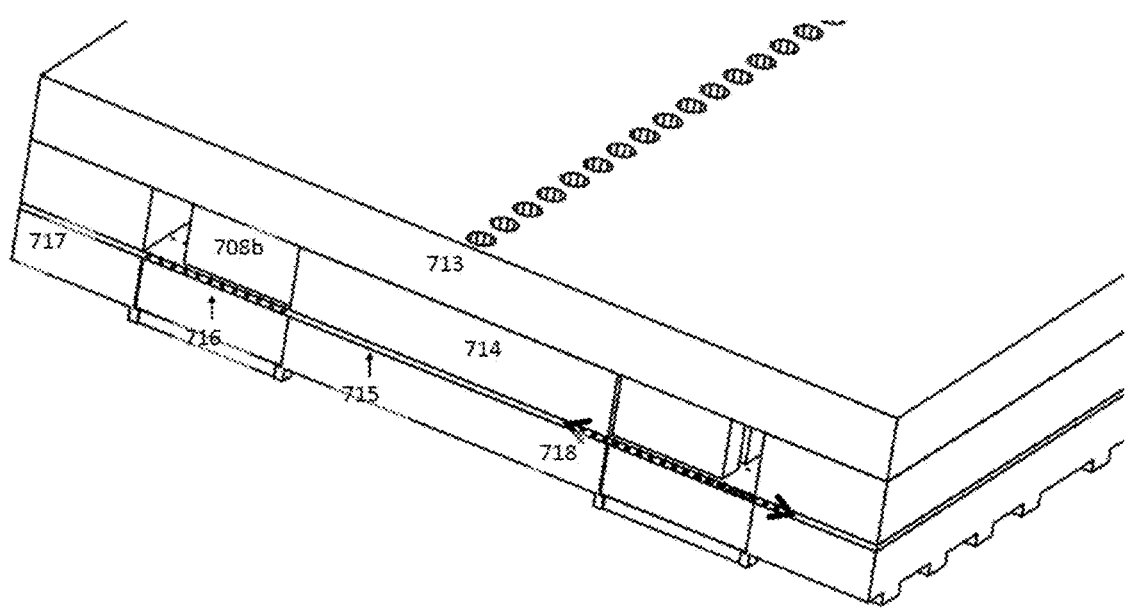
FIG. 7d shows the internal structure of the in-plane micronozzle array in a sectioned view according to an embodiment of the disclosed subject matter.

FIG. 7c shows the internal structure of the micronozzle array, including the delivery gas and exhaust distribution channels, according to an embodiment of the disclosed subject matter. FIG. 7c shows a cutaway of the structure along the length of a depositor and bisecting an exhaust via. Two delivery gas distribution channels 708a may run between the delivery vias at the sides of the depositor array. A delivery gas orifice array 709 may form the floor of the delivery gas distribution channel. The delivery gas orifice array 709 may separate the delivery gas distribution channel from the structures underneath it, while regulating the flow of delivery gas and organic vapor into each depositor. The delivery gas orifice array 709 may allow for a long array of depositors to be connected in series without producing non-uniform deposition along the length of the array. An exhaust distribution channel 710 may be disposed underneath the orifice array and may run perpendicularly to the delivery gas distribution channel. The exhaust distribution channel 710 may have an exhaust via 711 at its center. Each exhaust distribution channel 710 may be shared by adjacent depositors within a rank. An exhaust channel in each depositor may be separated from its adjacent exhaust distribution channel 710 by a thin wall, and both channels may be abutted by the delivery gas orifice array. Shallow trenches etched into the underside of the orifice layer may straddle the wall and provide flow paths between the exhaust channels in the depositors and the exhaust distribution channels. The size and spacing of these trenches are chosen to distribute exhaust flow evenly along the length of the depositor exhaust channel. This array of trenches may form the exhaust orifice array 712. Additional features, such as the delivery gas distribution system, may be shown in the exploded view along a separate parallel cross section that passes between exhaust vias in FIG. 7d. Fingerlike projections 708b may branch from the delivery distribution channel to provide delivery gas along the length of each depositor. In some embodiment, the micronozzle array may be a four-layer structure, including a relatively thick (e.g., >500 µm) lid 713 at its top with delivery and exhaust vias, a distribution layer 714 disposed beneath that may include the delivery gas distribution channels, and an orifice layer 715 beneath the distribution layer that forms the floor of the delivery gas distribution channels and fingers. The delivery orifices 716 are shown in a cross section view, extending through the width of the orifice layer 715 to the depositor layer underneath. The depositor layer 717 may be the fourth layer of the stack. A cross section 718 (depicted with a dashed line), as further illustrated in FIG. 8b, shows the upper surface of the depositor layer. This embodiment shows two mirror-image depositors on opposite sides of the row of exhaust vias. Other embodiments may include a single row of depositors, two rows of linearly offset depositors, and/or multiple rows of depositors.

Figure 8A:
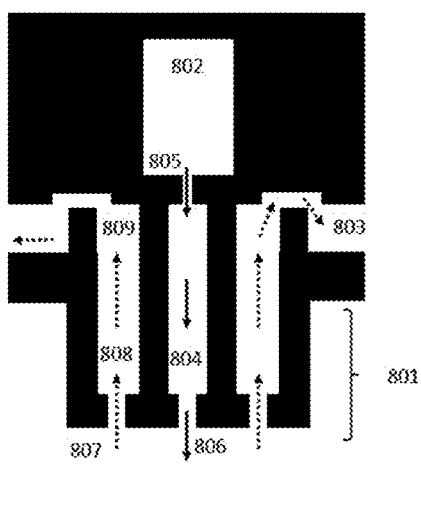
FIG. 8a shows a schematic cross section of an in-plane depositor and the gas flow through it according to an embodiment of the disclosed subject matter.
Figure 8B:
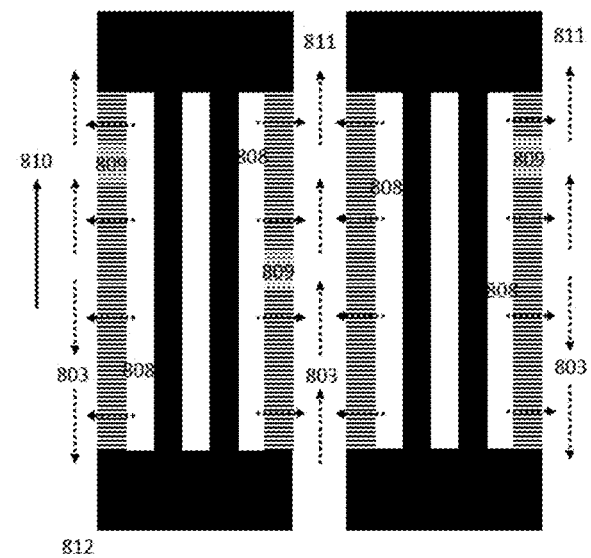
FIG. 8b shows a schematic of an in-plane depositor sectioned through the exhaust distribution channel, parallel to the plane of the delivery gas orifice array according to an embodiment of the disclosed subject matter.

FIG. 8a shows an internal structure of a depositor from a section across the width of a depositor as shown in FIG. 7a according to an embodiment of the disclosed subject matter. Each depositor 801 may be disposed below delivery gas distribution channel 802 and exhaust gas distribution channel 803. A delivery channel 804 of the depositor 801 may be connected to the delivery gas distribution channel 802 through one or more delivery orifices 805. The delivery aperture 806 may be located at the other end of the delivery channel 804 downstream of the delivery orifice 805 and may shape the jet of delivery gas that impinges on the substrate. The delivery aperture 806 may have less flow restriction than the delivery orifice 805. Delivery as flow direction is shown by solid arrows in FIG. 8a.

Exhaust gasses may be withdrawn from the deposition zone underneath the depositor 801 through exhaust apertures 807 that lead to exhaust channels 808 running colinear with the delivery channel 804. Each exhaust channel 808 may connect to an exhaust distribution channel through an array of etched pockets 809 in the underside of the orifice layer. These structures form an exhaust orifice array that has greater flow restriction than the exhaust apertures and spreads exhaust flow evenly along the length of an exhaust channel and into the exhaust distribution channel.

FIG. 8b shows the depositor sectioned through the exhaust distribution channel, parallel to the plane of the delivery gas orifice array. Depositors may be long in the print direction 810 to maximize printing speed. An array of orifices may distribute exhaust evenly along the exhaust channel 808 as it rises into the exhaust gas distribution channels 803. Exhaust may be removed from the portions of the exhaust channel 808 towards the side of the depositor 811 closest to the exhaust via. The exhaust orifice array may prevent the far end of the depositor from becoming exhaust starved.

Figure 9A:
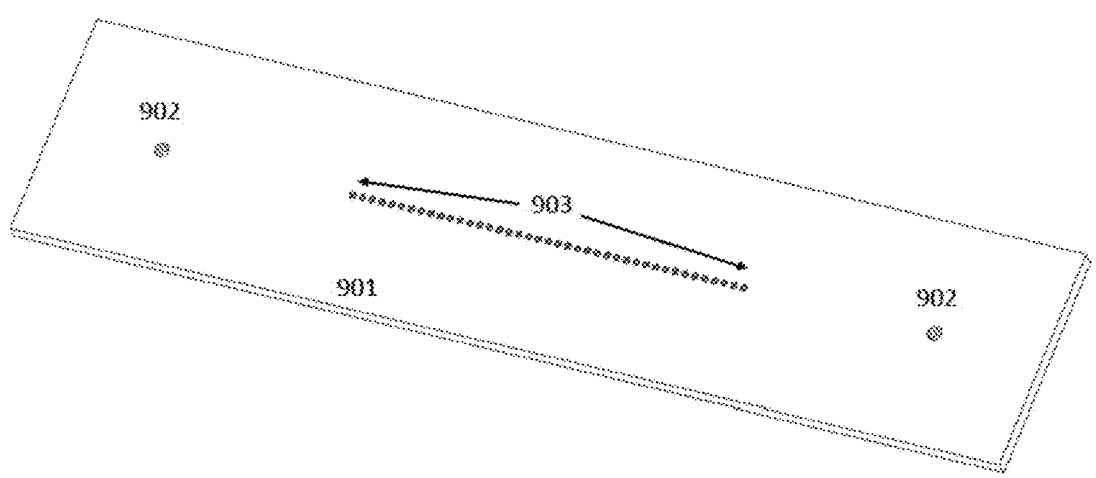
FIG. 9a shows the lid layer of a micronozzle array die prior to assembly according to an embodiment of the disclosed subject matter.

In an embodiment of the disclosed subject matter, the micronozzle array may be fabricated from two double side polished (DSP) wafers of 300-600 µm in thickness and a silicon-on-insulator (SOI) wafer with a device layer of 10-50 µm in thickness. The thicknesses of each wafer may be determined by desired depositor dimensions and/or a performance envelope. An embodiment of the fabrication process is shown in FIG. 9, with the parts of the micronozzle array at various stages of fabrication. An individual die is shown for clarity, but a whole wafer of dice may be processed at once and separated afterward. Deep reactive etching (DRIE) may be used for each etch step. The first DSP wafer may be etched with trenches to form the lid 901 and with through holes and delivery 902 and exhaust vias 903 as illustrated in FIG. 9a.

Figure 9B:
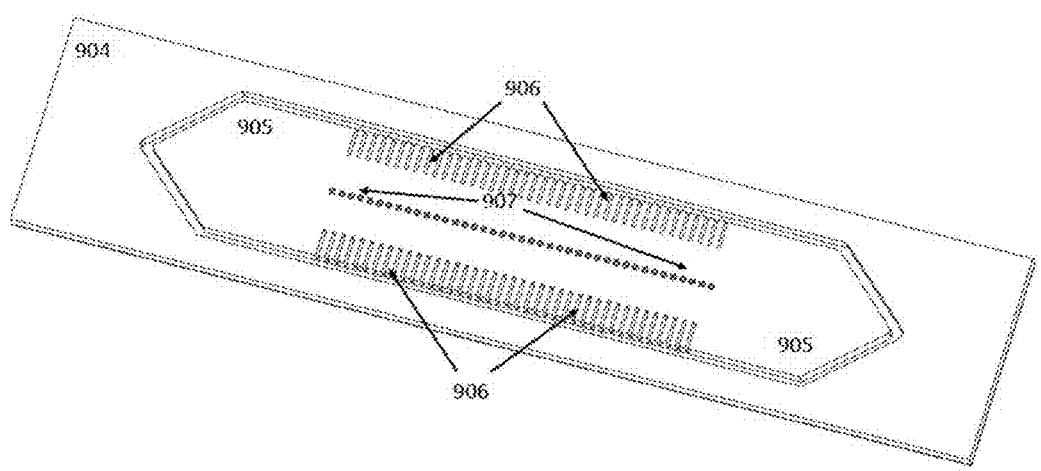
FIG. 9b shows the gas distribution layer of a micronozzle array prior to assembly according to an embodiment of the disclosed subject matter.
Figure 9C:
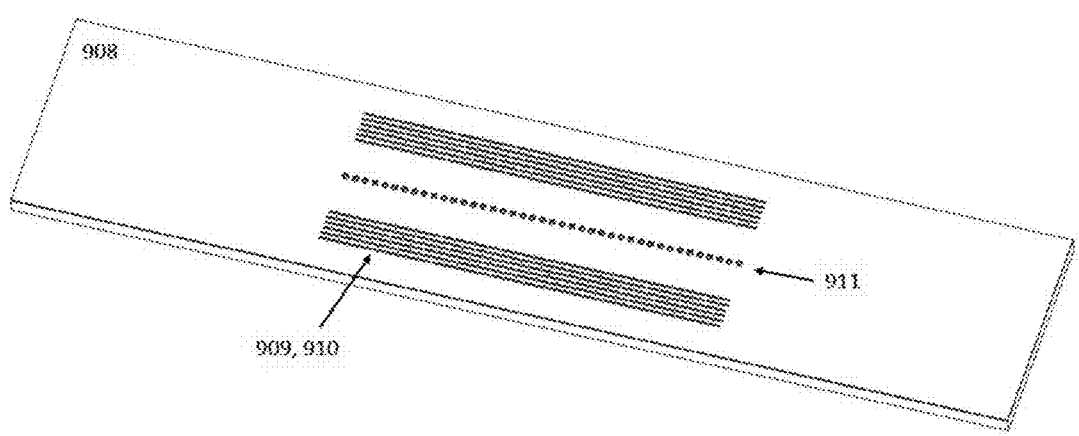
FIG. 9c shows the orifice layer of a micronozzle array die prior to assembly according to an embodiment of the disclosed subject matter.
Figure 9D:
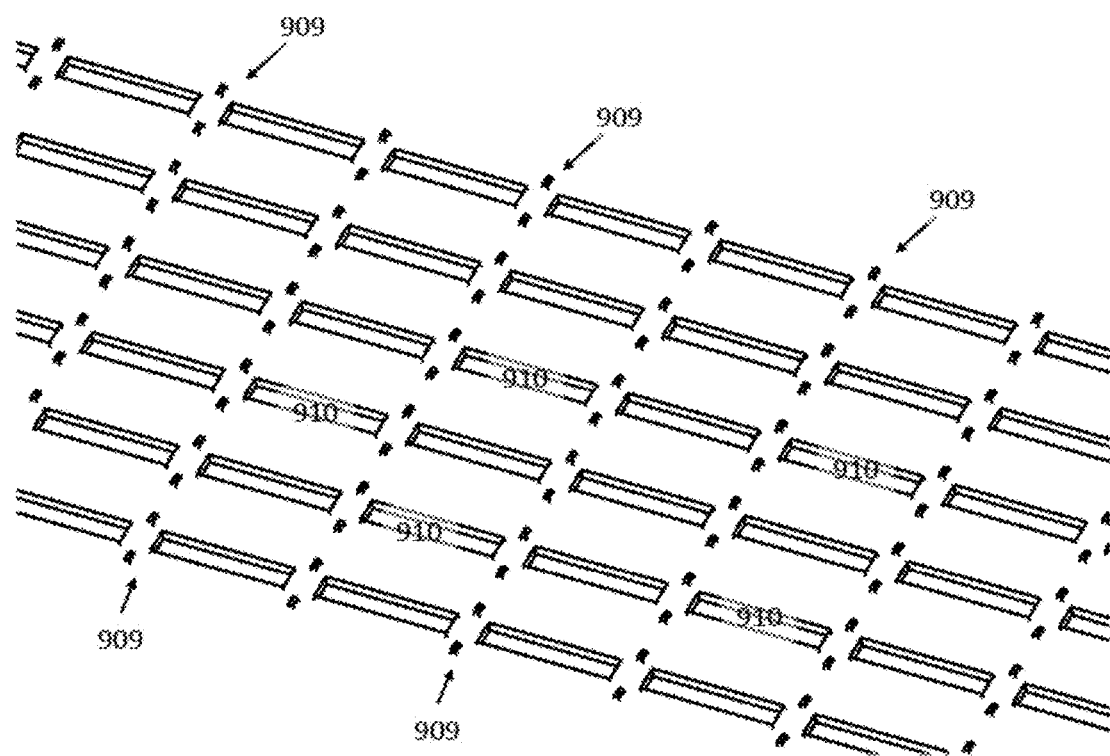
FIG. 9d shows an expanded view of the orifice layer microstructure according to an embodiment of the disclosed subject matter.

The handle layer 904 of the SOI wafer may be etched through its thickness to form the distribution layer, shown in FIG. 9b. The distribution layer may include delivery gas distribution channels 905 and fingers 906. Exhaust vias 907 may extend through the distribution layer. FIG. 9c shows the device layer 908 on the other side of the SOI wafer, which is etched to form the orifice layer. The orifice layer etch may be nested so that delivery orifices 909 extend through its thickness, while the pockets 910 that form the exhaust orifice arrays may be formed by a shallower etch that does not extend through the whole device layer, as shown in FIG. 9d. Exhaust vias 911 may pass through the orifice layer. The buried oxide between the handle and device layers of the SOI wafer may be an etch stop for the through wafer etches on both sides, and may be removed after processing.

Figure 9E:
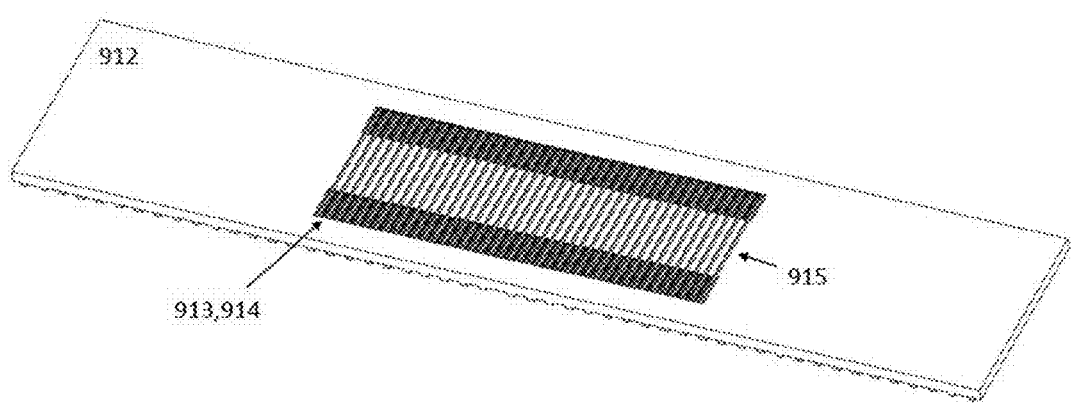
FIG. 9e shows the upper surface of the depositor layer of a micronozzle array die prior to assembly according to an embodiment of the disclosed subject matter.
Figure 9F:
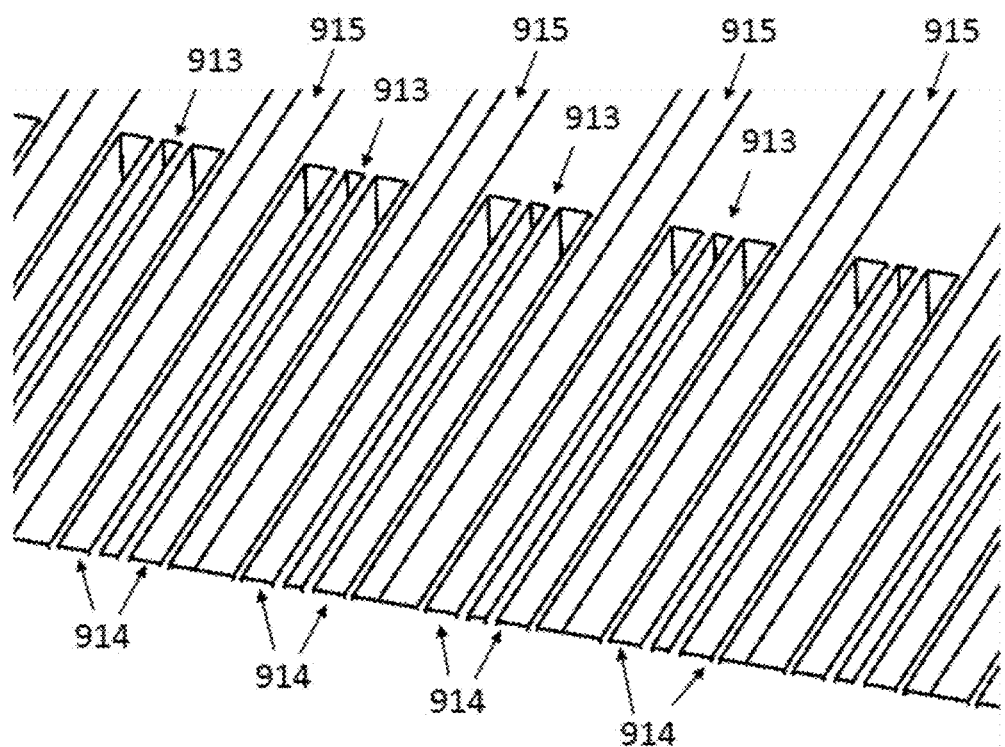
FIG. 9f an expanded view of the microstructure on the upper surface of the depositor layer according to an embodiment of the disclosed subject matter.

As shown in FIG. 9e, a second DSP wafer 912 may be etched with a network of trenches that may form the upstream portions of the delivery channels 913, the downstream portions of the exhausts channels 914, and the exhaust distribution channels 915. These structures may be formed with a nested etch. The depth of the trenches that form the exhaust distribution channels 915 may be greater than their width to permit relatively low restriction flow of exhaust. The trenches that become the delivery channels 913 and the exhaust channels 914 may be deep enough to connect to the exhaust and delivery apertures on the other side. An expanded view of this structure is shown in FIG. 9f.

Figure 9G:
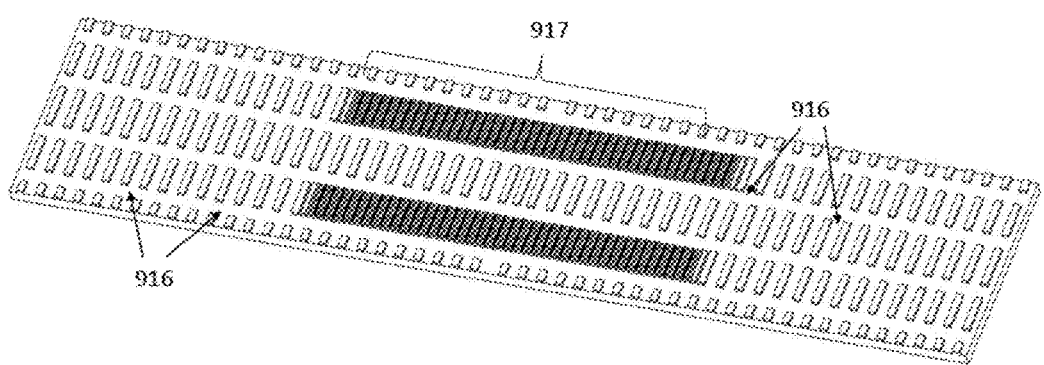
FIG. 9g shows the lower surface of the depositor layer of a micronozzle array die prior to assembly according to an embodiment of the disclosed subject matter.
Figure 9H:
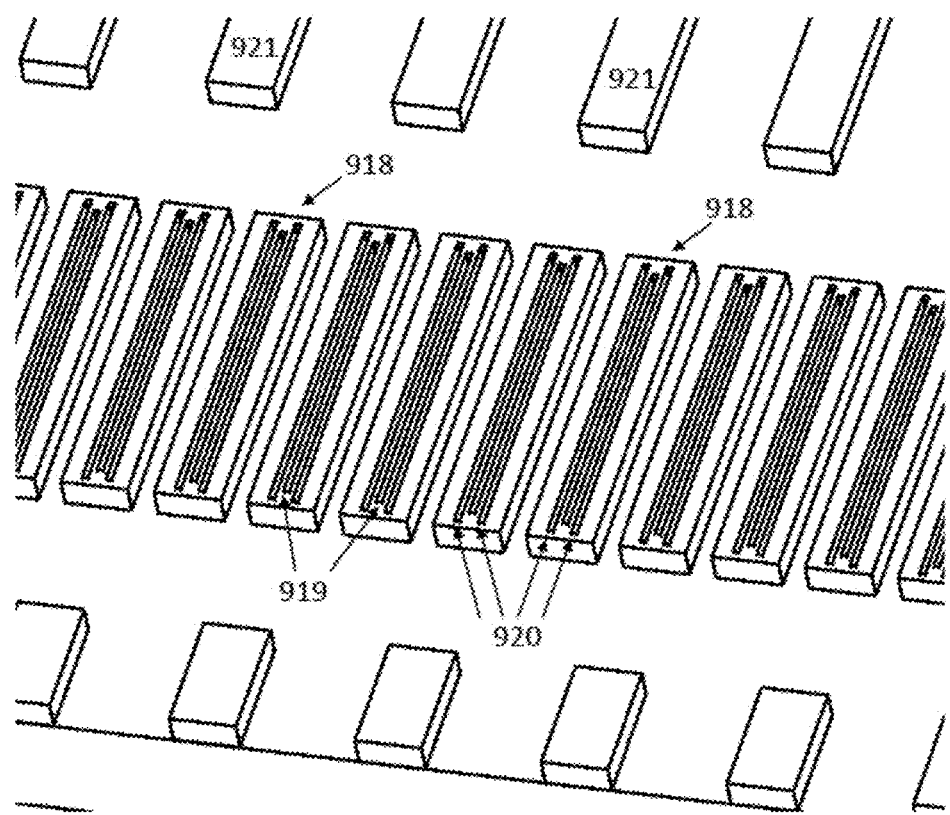
FIG. 9h shows an expanded view of the microstructure on the lower surface of the depositor layer according to an embodiment of the disclosed subject matter.

The underside of the second DSP wafer is shown in FIG. 9g. This side (i.e., the underside) faces the substrate during operation. The surface may be etched to form recesses 916 between raised bosses to facilitate gas flow around the underside of the array. Some bosses may include depositors arranged in one or more linear arrays 917 that have delivery and exhaust apertures etched into them. The features on this side may be generated in a single layer etch or by a plurality of nested edges. An expanded view of this structure is shown in FIG. 9h. Each depositor boss 918 may have delivery apertures 919 and exhaust aperture 920 on its raised face. Delivery apertures 919 may connect to delivery channels etched into the other side of the wafer and the exhaust apertures 920 may connect to exhaust channels etched into the other side of the wafer as well. Other bosses 921 may be solid, and may provide mechanical support and protection for portions of the structure during fabrication and operation.

Figure 9I:
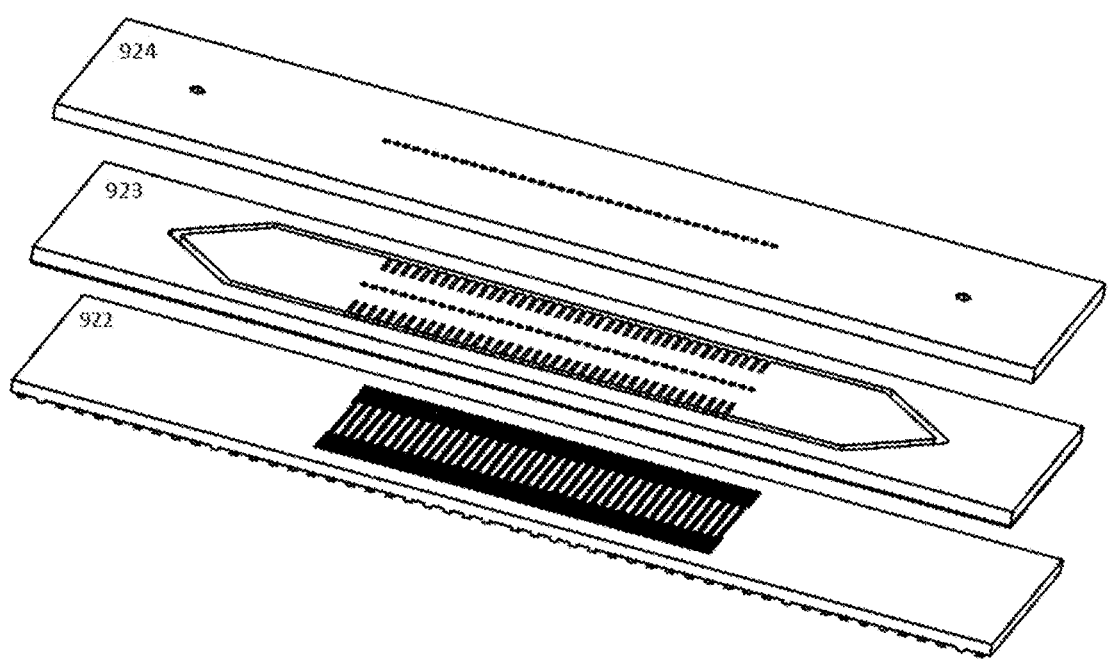
FIG. 9i shows the lid, distribution, orifice, and depositor layers arranged in an expanded view prior to bonding according to an embodiment of the disclosed subject matter.

Once etching is completed, the structure may be assembled by wafer bonding as shown in FIG. 9i. The depositor layer 922 may be bonded to the orifice and distribution layers formed by the SOI wafer 923 with a technique such as fusion bonding, or the like. This bond may connect the delivery channels in the depositor layer with the delivery orifices and delivery gas distribution channels in the SOI wafer. The bond may cover the exhaust distribution channels on the depositor layer. The lid layer 924 may be bonded to the distribution layer using a technique such as fusion bonding. This may cover the delivery gas distribution channel while permitting the depositor layer to be addressed through delivery and exhaust vias on the lid surface.

The delivery gas orifice array may regulate flow to an array of depositors connected to a common gas distribution channel. Orifice plates may generally use a large pressure drop to evenly split flow in this configuration, but the pressure drop along the delivery gas path may be minimized to achieve best results from the OVJP process. In some embodiments, an orifice array may be provided with orifices of varying conductivity. The least conductive orifices may guide flow into depositors near the delivery gas source, while more conductive orifices may guide flow into depositors further from the source, where the pressure in the delivery gas distribution channel is lower.

Figure 10A:
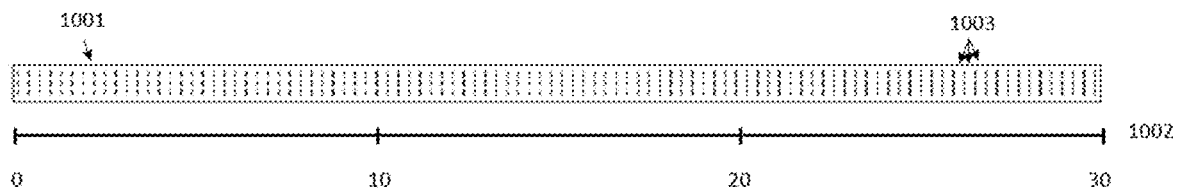
FIG. 10a shows the delivery gas distribution channel and delivery gas orifice plate according to an embodiment of the disclosed subject matter.

The delivery channel orifice plate 1001 is shown in detail in FIG. 10a. Distance from the depositor closest to the delivery via is measured on the horizontal axis 1002 in millimeters. The apertures 1003 serving each delivery channel are clustered in groups of 3 with a constant length of 10 µm along the channel axis. The apertures pass through a 20 µm thick membrane. The apertures may become wider with increasing distance from the delivery via, such as increasing in width from 110 to 184 µm. This may enable constant flow through the orifices, despite pressure variation in the delivery gas distribution channel. Varying the length of a slit orifice may change its flow resistance, since the resistance is inversely proportional to length. Thickness and width may also be varied between orifices to change resistance.

Figure 10B:
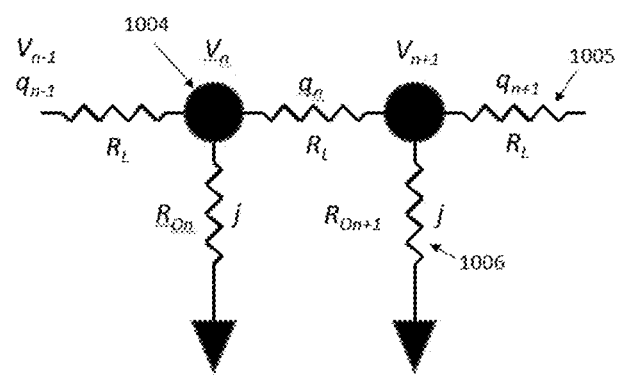
FIG. 10b shows an equivalent circuit model of the delivery gas distribution channel and delivery gas orifice plate according to an embodiment of the disclosed subject matter.
Figure 10C:
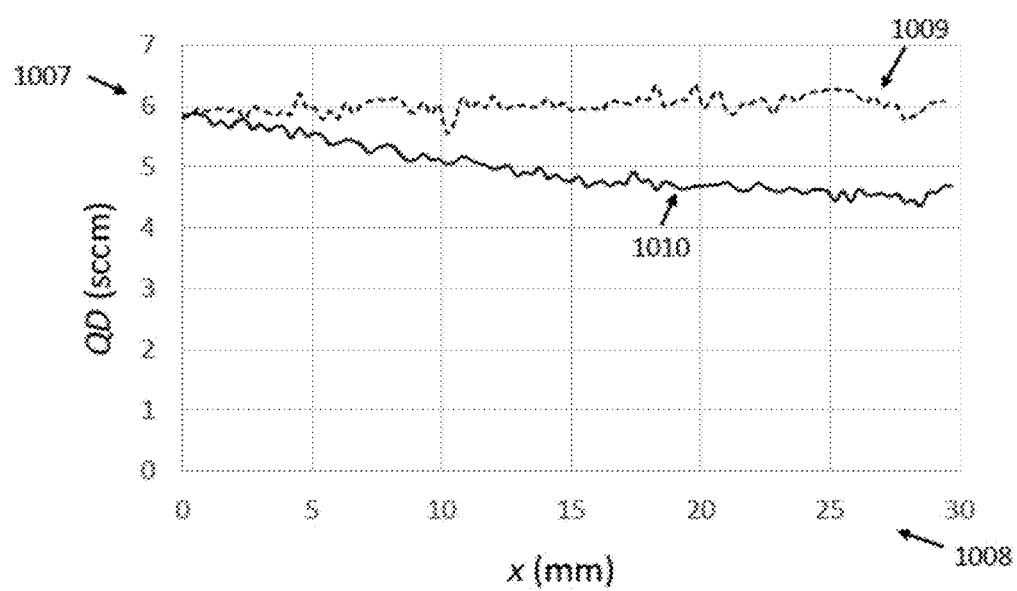
FIG. 10c shows the gas flow through a series of depositors connected to a common delivery gas distribution channel through an orifice according to an embodiment of the disclosed subject matter.

The orifice plate may be modeled as an equivalent circuit as shown in FIG. 10b. The one or more orifices serving each depositor feed delivery gas from a common location may be represented as a node 1004. The nodes may be numbered n from 1 to N, where n may be the number of depositor units to the via and N may be the total number of depositors fed by the via. In cases where a depositor array is fed by two vias, there may be 2N depositors, and n may be the number of depositors from the nearest via. Each node n may have a flow potential of $V_n$. Flow potential may refer to pressure or a power of pressure. The flow away from node n to node n+1 along the delivery gas distribution line may be $q_n$, and the flow through each orifice may be j. The resistance to flow along the delivery line may be $R_L$ 1005 and the resistance to flow through the orifice at node n may be $R_{O_n}$ 1006. These quantities may be related by the following equations. Equation 1 may be a conservation equation, and equations 2 and 3 may provide flow rates along the distribution channel and orifice for each node n, respectively. Equation 4 may be obtained from solving the previous equations to determine a relationship between the flow resistances of each orifice. The first orifice $R_{O1}$ may be sized appropriately for the desired flow rate and pressure drop, but the resistances of subsequent orifices are determined entirely by the array size and the resistance of the delivery gas distribution channel between nodes, so long as the print head is operated in a regime where equations 2 and 3 are valid and are linear. The orifice widths shown in FIG. 10a may be obtained using equation 4.

$$q_n = q_{n+1} + j \quad (1)$$

$$q_n = R_L(V_n - V_{n+1}) \quad (2)$$

$$V_n = R_{On} j \quad (3)$$

$$R_{On} = R_{O1} - R_L \sum_{m=2..n} (N - m) \quad (4)$$

The performance of a delivery gas orifice plate servicing 100 depositors was simulated with CFD (computational fluid dynamics) using COMSOL Multiphysics™ simulation software. Helium delivery gas may be suppled at a pressure of 300 Torr, a temperature of 600K, and a total mass flow rate of 600 sccm. Simulation results may be shown in FIG. 10c. The flow to each depositor may be shown on the vertical axis 1007 versus the position of each depositor on the horizontal axis 1008. The flow rates through the variable width apertures described above may be shown with a dashed line 1009. They may be compared with the flow rates through constant width apertures plotted with a solid line 1010. The orifice plate with variable width apertures may permit uniform flow to each depositor, within the numerical error of the simulation. An orifice plate with uniformly sized apertures of 110×10 μm, however, may starve the depositors on its downstream end of delivery gas.

Figure 11A:
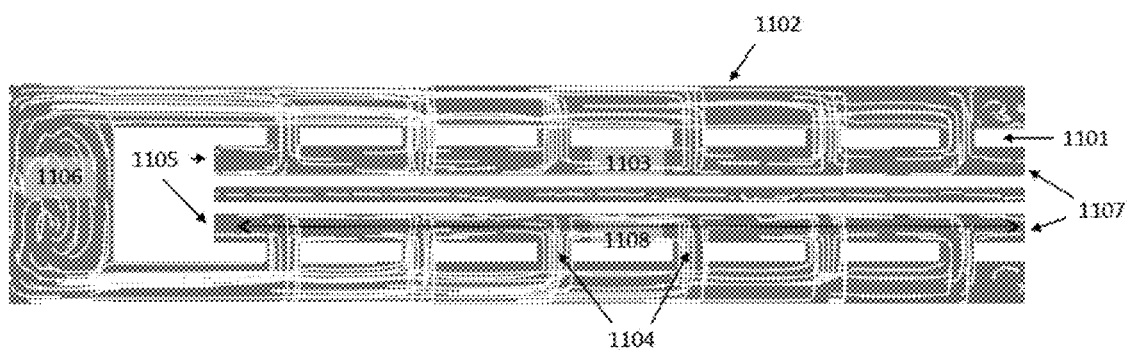
FIG. 11a shows the streamlines of flow from the exhaust channel of a depositor to the exhaust distribution channel through an exhaust orifice array according to an embodiment of the disclosed subject matter.

The exhaust distribution channels in the preferred embodiment may be shorter than the delivery gas distribution channel, but operates in a similar fashion to it in the preferred embodiment. The exhaust distribution channels may run perpendicular to the delivery gas distribution channel on the opposite side of the orifice layer. FIG. 11a shows an exhaust distribution channel and streamlines of exhaust flow. A Si membrane of approximately 25 μm in thickness 1101 may be formed by a trench sidewall that separates the exhaust distribution channel 1102 from the exhaust channel 1103. An array of orifices 1104 extending over the membrane may connect the exhaust distribution and exhaust channels. These orifices may distribute flow evenly along the length of the exhaust channel. Without them, exhaust may be drawn from the end 1105 of the exhaust channel closest to the exhaust via 1106 while flow from the far portion of the exhaust 1107 may be stagnant. As with the delivery gas distribution channel, the width of individual orifices in an array may be varied to promote uniform exhaust flow distribution. The placement of the x axis in FIG. 11b may be given by a black dotted line in the exhaust channel 1108.

Figure 11B:
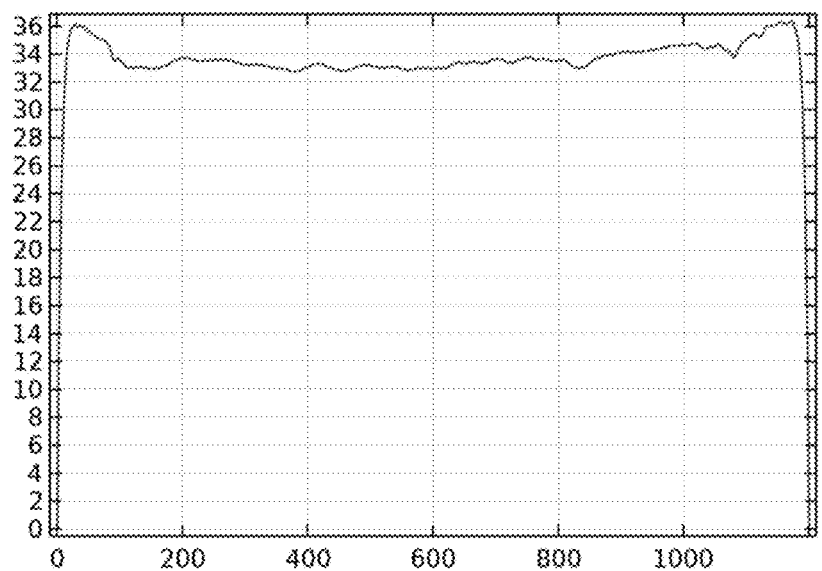
FIG. 11b shows a plot of exhaust gas flow speed as a function of position along the length of the depositor according to an embodiment of the disclosed subject matter.

The flow as a function of position in an exhaust channel along the length of a depositor is shown in FIG. 11b. The speed of exhaust gas flow up the exhaust channel is plotted on the vertical axis 1109, while position along the length of the depositor is plotted on the horizontal axis 1110 in microns. A horizontal coordinate of zero may correspond to the end of the exhaust channel closest to the exhaust via. The graph in FIG. 11b may indicate that there is no systematic variation in flow velocity for under typical operating conditions of 12 sccm $N_2$ exhaust per depositor section.

Highly conductive paths for heat transfer may exist across the die so that the depositor faces do not become fouled with condensed organic material. The depositors may be in proximity to the substrate and may be cooled by it if they are not in good thermal contact with the back side of the die. This may place limits on the void fraction tolerable within the die, because Si is a good heat conductor, while gasses are poor conductors. Furthermore, the fabrication process, particularly the bonding operation in FIG. 9i, may apply significant pressure to the die. The internal structure may be robust enough to resist this. Having silicon for a heat conduction path and mechanical reinforcement may lead to the finger structures present in the delivery gas distribution channels shown in FIG. 9b. A wide distribution channel in place of the fingers may not provide adequate thermal or mechanical connection between the front and back faces of the die.

Heat transfer through the die was modeled using COMSOL Multiphysics™ and simulation outputs are shown in FIG. 12. A single depositor and its surrounding channels may be shown in cross-section like in FIG. 8a. FIG. 12a may be a contour plot that shows the temperature in Kelvin. The top boundary may be at 600K 1201, while the lower surface of the depositor is at 595K 1202. The substrate 1203 may be located 50 μm below the depositor and may have a temperature of 293K. This result indicates that temperature within the die may be consistent, despite the proximity of its lower face to a cool substrate. The temperature gradient along the silicon dividers 1204 to each side of the delivery gas distribution channel finger 1205 may be gradual, indicating efficient conduction of heat down these dividers. The gradient may become more intense in the lower depositor 1206 due to the dense packing of delivery and exhaust channels necessitating efficient conduction paths.

Lines of heat flow from top to bottom of this structure may be shown in FIG. 12b. Lines of flux may avoid gas filled channels like the delivery gas distribution channel finger and the exhaust channels 1207. They may be moderately dense in the dividers flanking the delivery gas distribution channel finger, but they may become concentrated in both the Si wall 1208 between the exhaust channels and exhaust distribution channels and in the Si walls surrounding the exhaust channels 1209. While these conduction paths may be narrower, they may provide adequate heat transfer to maintain the temperature of the lower tip of the die. There may be an unbroken path for heat transport through the Si of the die along its thickness.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
a micronozzle array including:
a linear array having a plurality of depositors connected in series, wherein a first depositor of the plurality of depositors borders a second depositor on a least one side boundary;
at least one heater to heat the plurality of depositors of the linear array; and
a plurality of orifice arrays, wherein a width of each orifice in the plurality of orifice arrays is 20 μm or less in a minor axis of its cross section to flow, to regulate flow through a delivery gas distribution channel and a plurality of exhaust distribution channels, wherein the delivery gas distribution channel and at least one of the plurality of exhaust distribution channels have separate fluid communication with each of the plurality of depositors.

2. The device of claim 1, further comprising a plurality of ranks of the linear array of depositors, wherein a first edge or a second edge of each depositor are defined by a first edge or a second edge of the micronozzle array.

3. The device of claim 1, wherein the linear array having the plurality of depositors further comprises confinement gas distribution trenches disposed between at least the first depositor and the second depositor.

4. The device of claim 1, wherein the linear array having the plurality of depositors comprises a plurality of delivery apertures, which are fed from the delivery gas distribution channel.

5. The device of claim 1, wherein a length in a print direction of each aperture of the depositors in the array is 50 μm to 5 mm.

6. The device of claim 1, wherein each depositor of the linear array having the plurality of depositors is separated from one exhaust by a first spacer on one side, and a second spacer on another side, wherein the first spacer is narrower than the second spacer.

7. The device of claim 1, wherein the micronozzle array is disposed on one face of a die that is affixed to a carrier plate on an opposite face of the die, and wherein the carrier plate is sealed to a manifold by using gaskets.

8. The device of claim 1, wherein the micronozzle array is disposed on one face of a die that is affixed to a carrier plate on an opposite face of the die, wherein the carrier plate is bolted to a manifold.

9. The device of claim 1, wherein each depositor is formed on a boss, and a recessed region is disposed between bosses.

10. The device of claim 9, wherein a height of the boss from the recessed region is 0-200 μm.

11. The device of claim 1, wherein the plurality of depositors of the linear array are staggered.

12. The device of claim 1, wherein the plurality of exhaust distribution channels are disposed perpendicular to the delivery gas distribution channel.

13. The device of claim 12, wherein at least one of the plurality of exhaust distribution channels is shared by adjacent depositors of the linear array within a rank.

14. The device of claim 1, wherein the micronozzle array comprises:
a first layer, having a first surface and second surface, adjacent to a carrier plate;
a second layer, having a first surface and a second surface, adjacent to a substrate; and
a device layer disposed between the first layer and the second layer that includes a pattern of holes,
wherein the first layer and the second layer are patterned with holes and trenches on their first and second surfaces, respectively, and
wherein a thickness of the first layer and the second layer is greater than the device layer.

15. The device of claim 14, wherein at least one of the first layer and the second layer has a thickness that is greater than 300 μm, and
wherein the device layer has a thickness that is less than or equal to 100 μm.

16. The device of claim 1, wherein the micronozzle array comprises a plurality of double side polished (DSP) wafers and a silicon-on-insulator wafer,
wherein a handle layer of the silicon-on-insulator wafer has a thickness of 300-600 μm and a device layer of a silicon-on-insulator wafer has a thickness of 10-50 μm.

17. The device of claim 1, wherein one of the plurality of orifice arrays is a delivery channel orifice array that includes apertures that are coupled to the delivery gas distribution channel via a delivery channel.

18. The device of claim 17, wherein the apertures are clustered in groups of three, with a constant length of 10 μm along a channel axis.

19. The device of claim 17, wherein the apertures are wider with increasing distance from a delivery via,
wherein the apertures increase in width from 110 to 184 μm.

20. The device of claim 1, further comprising: an unbroken heat conduction path of solid material disposed parallel to a normal vector to a face of the device.

* * * * *